(12) United States Patent
Tachibana et al.

(10) Patent No.: US 7,605,601 B2
(45) Date of Patent: Oct. 20, 2009

(54) SEMICONDUCTOR INTEGRATED CIRCUIT DEVICE

(75) Inventors: Fumihiko Tachibana, Kawasaki (JP); Takahiro Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 12/105,638

(22) Filed: Apr. 18, 2008

(65) Prior Publication Data

US 2008/0258771 A1    Oct. 23, 2008

(30) Foreign Application Priority Data

Apr. 19, 2007    (JP) .............................. 2007-110578
Mar. 18, 2008    (JP) .............................. 2008-069670

(51) Int. Cl.
*H03K 17/16* (2006.01)
(52) U.S. Cl. ............................. 326/21; 326/82; 327/534
(58) Field of Classification Search ................... 326/21, 326/26, 27, 82–87; 327/530, 534, 535
See application file for complete search history.

(56) References Cited

U.S. PATENT DOCUMENTS

| | | | |
|---|---|---|---|
| 6,512,394 B1 * | 1/2003 | Parris ........................... | 326/34 |
| 6,593,799 B2 * | 7/2003 | De et al. ...................... | 327/534 |
| 6,864,539 B2 | 3/2005 | Ishibashi et al. | |
| 6,943,613 B2 | 9/2005 | Miyazaki et al. | |
| 7,368,976 B2 * | 5/2008 | Gupta et al. ................. | 327/534 |
| 2005/0052219 A1 | 3/2005 | Butler et al. | |

FOREIGN PATENT DOCUMENTS

JP    2004-289107    10/2004

* cited by examiner

*Primary Examiner*—Don P Le
(74) *Attorney, Agent, or Firm*—Oblon, Spivak, McClelland, Maier & Neustadt, L.L.P.

(57) ABSTRACT

A semiconductor integrated circuit device, has a semiconductor substrate; and a first transistor of a first conductivity type and a second transistor of the first conductivity type, the transistors being connected in series between a first power supply line and a first substrate well provided on the semiconductor substrate, the semiconductor integrated circuit device further comprising a first transistor of a second conductivity type and a second transistor of the second conductivity type, the transistors being connected in series between the second power supply line and a second substrate well provided on the semiconductor substrate.

19 Claims, 26 Drawing Sheets

| Cbp1 | Cbp2 | Vbp |
|---|---|---|
| L | L | VDD |
| H | L | Vbp1 |
| H | H | Vbp2 |

| Cbn1 | Cbn2 | Vbn |
|---|---|---|
| H | H | VSS |
| L | H | Vbn1 |
| L | L | Vbn2 |

| OPERATION MODE | Cbp1 | Cbp2 |
|---|---|---|
| STANDBY MODE | L | L |
| LOW-TEMPERATURE OPERATION MODE | H | L |
| HIGH-TEMPERATURE OPERATION MODE | H | H |

| OPERATION MODE | Cbn1 | Cbn2 |
|---|---|---|
| STANDBY MODE | H | H |
| LOW-TEMPERATURE OPERATION MODE | L | H |
| HIGH-TEMPERATURE OPERATION MODE | L | L |

| OPERATION MODE | Cbp1 | Cbp2 |
|---|---|---|
| STANDBY MODE | L | L |
| LOW-TEMPERATURE OPERATION MODE | H | H |
| HIGH-TEMPERATURE OPERATION MODE | H | L |

| OPERATION MODE | Cbn1 | Cbn2 |
|---|---|---|
| STANDBY MODE | H | H |
| LOW-TEMPERATURE OPERATION MODE | L | L |
| HIGH-TEMPERATURE OPERATION MODE | L | H |

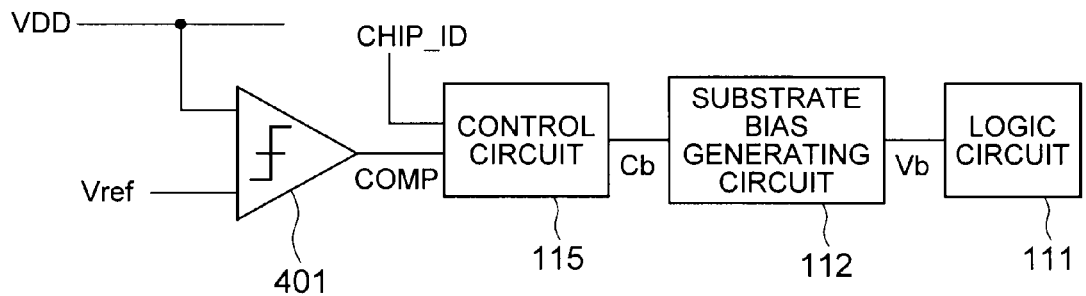
FIG.19
|  | Vth>Vth_target | Vth≦Vth_target |
|---|---|---|
| VDD>Vref | Cb=L(ZBB) | Cb=L(ZBB) |
| VDD≦Vref | Cb=H(FBB) | Cb=L(ZBB) |
FIG.20
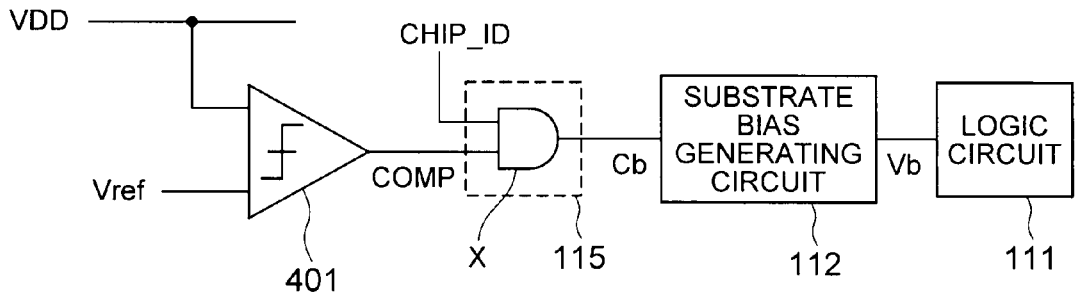
FIG.21

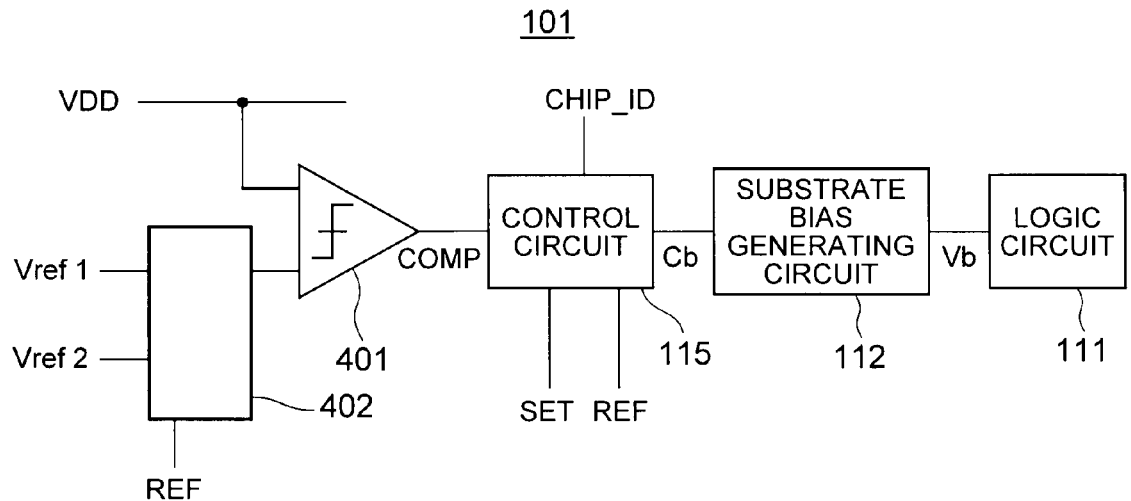
FIG.22
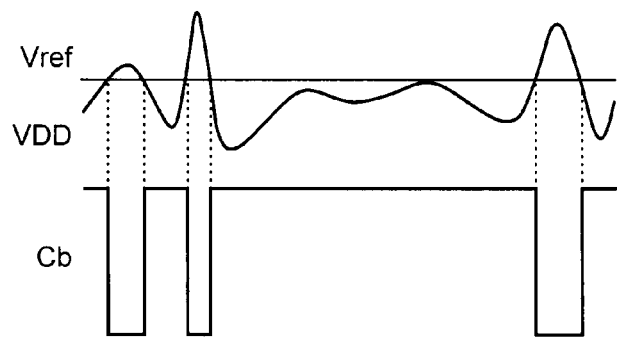
FIG.23
CHIP_ID = H
| | COMP=H | COMP=L |
|---|---|---|
| REF=H(Vref1) | Cb=L(ZBB) | Cb=PREVIOUS VALUE |
| REF=L(Vref2) | Cb=PREVIOUS VALUE | Cb=H(FBB) |
FIG.24

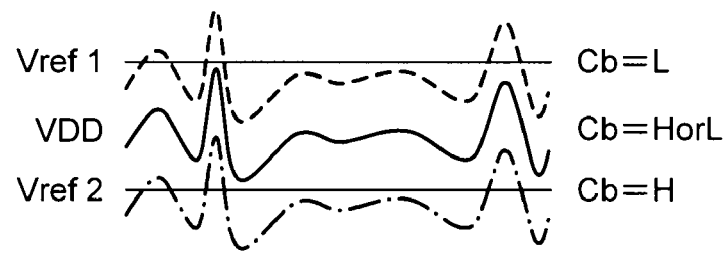
FIG.25
| | Vth>Vth_target | Vth≦Vth_target |
|---|---|---|
| VDD>Vref 1 | Cb=L(ZBB) | Cb=L(ZBB) |
| Vref 2<VDD≦Vref 1 | Cb=L or H | Cb=L(ZBB) |
| VDD≦Vref 2 | Cb=H (FBB) | Cb=L(ZBB) |
FIG.26
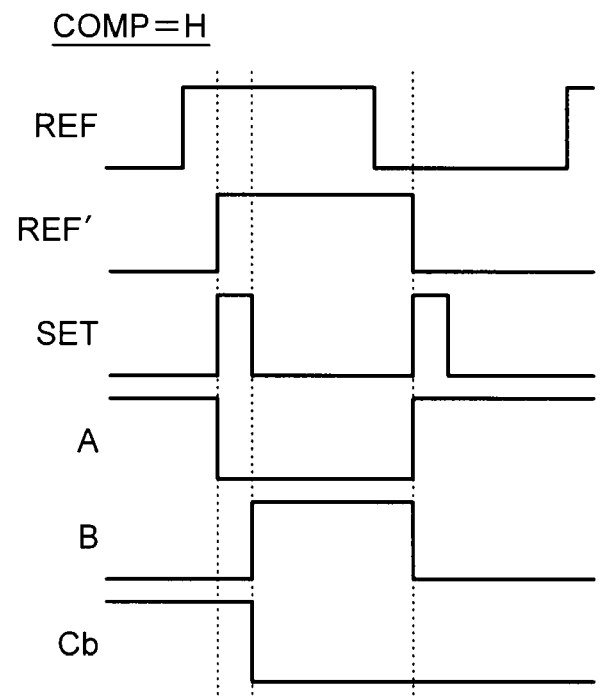
FIG.27

US 7,605,601 B2

SEMICONDUCTOR INTEGRATED CIRCUIT DEVICE

CROSS-REFERENCE TO RELATED APPLICATION

This application is based upon and claims the benefit of priority from the prior Japanese Patent Application No. 2007-110578, filed on Apr. 19, 2007, and No. 2008-069670, filed on Mar. 18, 2008, the entire contents of which are incorporated herein by reference.

BACKGROUND OF THE INVENTION

1. Field of the Invention

The present invention relates to a semiconductor integrated circuit device, for example, a semiconductor integrated circuit device including a transistor used by applying a substrate bias.

2. Background Art

In recent years, variations in manufacturing processes among CMOS devices have increased as CMOS becomes finer, increasing variations in performance among IC chips.

When designing ICs, it is necessary to consider both of the worst condition of an operating rate and the worst condition of power consumption. An increase of variations in performance among IC chips makes it difficult to respond to the worst conditions, so that IC designs may become more difficult.

As a technique for suppressing variations in performance among IC chips, a substrate bias technique has been known. In such a substrate bias technique, a substrate potential (back gate) is set higher than a source potential and a substrate bias of a forward bias is generated, so that the threshold voltage of a transistor is controlled.

In this case, the forward bias is generated by, for example, connecting a voltage source to a substrate node. However, since a PN junction is present between a substrate and a source, a substrate voltage exceeding a forward voltage drop causes a large leakage current on the substrate. Further, the forward voltage drop changes with temperatures and a large leakage current occurs at high temperatures at a substrate voltage lower than 0.6 V which is a forward voltage drop at room temperature. For this reason, the substrate voltage has to be sufficiently smaller (e.g., 0.45 V) than 0.6 V in consideration of a temperature change.

Another known method is, for example, to pass current through a substrate by means of a current source circuit and use, as a substrate bias, a forward voltage generated on a PN junction (for example, see Japanese Patent Laid-Open No. 2004-289107). In this method, a predetermined amount of current is passed through the PN junction, so that even when a temperature changes, it is possible to apply the maximum allowable substrate bias at each temperature.

In this method, when the control signal of the current source circuit fluctuates because of the influence of crosstalk noise and the like, the amount of substrate current may considerably change.

Although it is necessary to estimate the amount of substrate current according to the size of a logic circuit (PN junction area), a ratio of a logic circuit area to an integrated circuit area (the utilization of a cell) may vary for each integrated circuit or the circuit design of an integrated circuit may be repeatedly changed in response to the retry and optimization of logic synthesis, so that it is difficult to identify the size of the logic circuit. Therefore, it is not easy to estimate the amount of substrate current according to the size of the logic circuit.

SUMMARY OF THE INVENTION

According to one aspect of the present invention, there is provided: a semiconductor integrated circuit device, comprising:

a semiconductor substrate; and a first transistor of a first conductivity type and a second transistor of the first conductivity type, the transistors being connected in series between a first power supply line and a first substrate well provided on the semiconductor substrate, the first transistor of the first conductivity type having a source or drain connected to the first power supply line and a gate fed with a first control signal inputted from outside, the second transistor of the first conductivity type having a source or drain connected to the first substrate well and a gate connected to a second power supply line, the semiconductor integrated circuit device further comprising a first transistor of a second conductivity type and a second transistor of the second conductivity type, the transistors being connected in series between the second power supply line and a second substrate well provided on the semiconductor substrate, the first transistor of the second conductivity type having a source or drain connected to the second power supply line and a gate fed with a second control signal inputted from the outside, the second transistor of the second conductivity type having a source or drain connected to the second substrate well and a gate connected to the first power supply line.

According to the other aspect of the present invention, there is provided: a semiconductor integrated circuit device, comprising:

a semiconductor substrate; and a first transistor of a first conductivity type and a first transistor of a second conductivity type, the transistors being connected in series between a first power supply line and a first substrate well provided on the semiconductor substrate, the first transistor of the first conductivity type having a source or drain connected to the first power supply line and a gate fed with a first control signal inputted from outside, the first transistor of the second conductivity type having a source or drain connected to the first substrate well and a gate connected to the first power supply line, the semiconductor integrated circuit device further comprising a second transistor of the first conductivity type and a second transistor of the second conductivity type, the transistors being connected in series between a second power supply line and a second substrate well provided on the semiconductor substrate, the second transistor of the second conductivity type having a source or drain connected to the second power supply line and a gate fed with a second control signal inputted from the outside, the second transistor of the first conductivity type having a source or drain connected to the second substrate well and a gate connected to the second power supply line.

According to further aspect of the present invention, there is provided: a semiconductor integrated circuit device, comprising:

a semiconductor substrate;

a logic cell formed on the semiconductor substrate; and a fill cell disposed in a region different from the logic cell on the semiconductor substrate, wherein the fill cell includes a plurality of pairs of transistors of a first conductivity type and a second conductivity type, the transistor of the second conductivity type being formed on a first substrate well, the transistor of the first conductivity type being formed on a second substrate well.

BRIEF DESCRIPTION OF THE DRAWINGS

FIG. 19 is a circuit diagram showing a semiconductor integrated circuit device of a ninth embodiment;

FIG. 20 is a table for explaining the control signal Cb of the ninth embodiment;

FIG. 21 shows a specific example of the circuit shown in FIG. 19;

FIG. 22 is a circuit diagram showing a semiconductor integrated circuit device 101 of a tenth embodiment;

FIG. 23 shows the relationship between Vref and VDD;

FIG. 24 is a table for explaining the control signal Cb of the tenth embodiment;

FIG. 25 shows the relationship between Vref1, Vref2 and VDD;

FIG. 26 is a table for explaining the control signal Cb of the tenth embodiment;

FIG. 27 is a timing chart in the tenth embodiment;

DETAILED DESCRIPTION

Embodiments of the present invention will now be described.

In the embodiments of the present invention, a substrate bias voltage is stably generated according to (1) and (2) below:

(1) A substrate bias is generated using a substrate bias generating circuit, by means of parasitic diodes resulting from a PN junction.

(2) A constant PN junction area is formed in an integrated circuit regardless of the utilization of a logic cell, by means of a PN junction placed on a part (fill cell) other than the logic cell in the integrated circuit.

First, the substrate bias generating circuit described in (1) and a layout on a substrate of the circuit will be described in first to fourteenth embodiments.

Next, a method of forming the constant PN junction area in the integrated circuit in (2) will be described in fifteenth and subsequent embodiments.

First Embodiment

Figure 1:
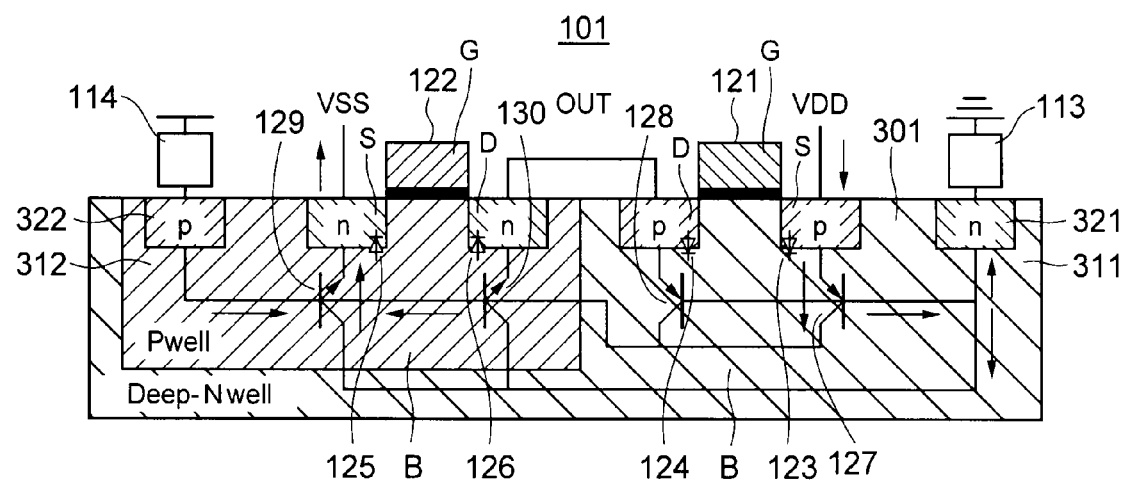
FIG. 1 is a side sectional view showing a semiconductor integrated circuit device of a first embodiment.

FIG. 1 is a side sectional view showing a semiconductor integrated circuit device 101 of a first embodiment.

The semiconductor integrated circuit device 101 of the first embodiment includes a PMOS 121 (hereinafter, will be referred to as a pMOS), an nMOS 122 (hereinafter, will be referred to as an nMOS), a substrate bias generating circuit 113 for a pMOS, and a substrate bias generating circuit 114 for an nMOS. FIG. 1 further shows the gates (G), sources (S), drains (D), and bodies (B) of the pMOS 121 and the nMOS 122.

The semiconductor integrated circuit device 101 includes a substrate 301. The substrate 301 includes an N well 311 which acts as a substrate well corresponding to a deep N well and a P well 312 which acts as substrate well. The pMOS 121 is formed on the N well 311 and the nMOS 122 is formed on the P well 312. The substrate 301 further includes an n+ diffusing region 321 surrounded by the N well 311 and a p+ diffusing region 322 surrounded by the P well 312.

As will be described later, the substrate bias generating circuit 113 for a pMOS has a current source transistor 131 for a PMOS. The current source transistor 131 for a pMOS is connected to the n+ diffusing region 321. Further, as will be described later, the substrate bias generating circuit 114 for an nMOS has a current source transistor 141 for an nMOS. The current source transistor 141 for an nMOS is connected to the p+ diffusing region 322.

The semiconductor integrated circuit device 101 includes parasitic diodes 123, 124, 125 and 126 and parasitic bipolars 127, 128, 129 and 130 between SB (source and body) of the PMOS 121, DB (drain and body) of the pMOS 121, SB of the nMOS 122, and DB of the nMOS 122, respectively. The parasitic diodes 123 to 126 are each formed by a PN structure in the substrate 301. The parasitic bipolars 127 to 130 are each formed by a PNP structure or an NPN structure in the substrate 301.

In the present embodiment, a current Ibp of the current source transistor 131 passes through the parasitic diodes 123 and 124 in the forward direction, so that a substrate bias voltage Vbp is generated in the N well 311 (the body of the PMOS 121). Further, in the present embodiment, a current Ibn of the current source transistor 141 passes through the parasitic diodes 125 and 126 in the forward direction, so that a substrate bias voltage Vbn is generated in the P well 312 (the body of the nMOS 122). The detail of the substrate bias voltages will be specifically described below.

Figure 2:
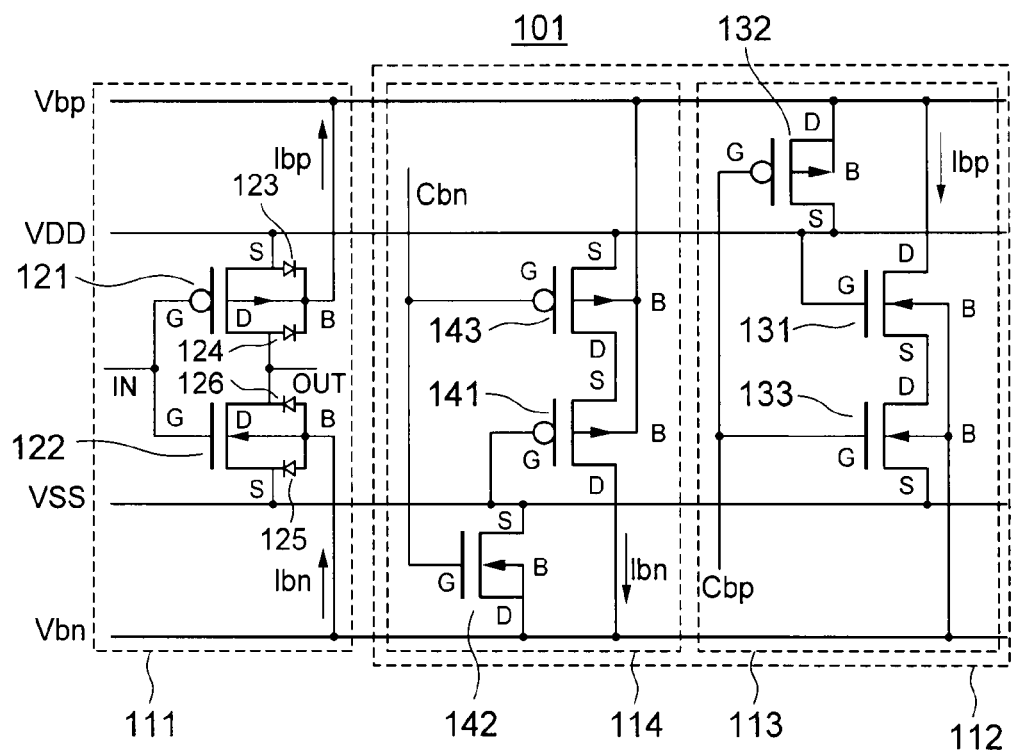
FIG. 2 is a circuit configuration diagram showing the semiconductor integrated circuit device of the first embodiment.

FIG. 2 is a circuit configuration diagram showing the semiconductor integrated circuit device 101 of the first embodiment.

FIG. 2 conceptually shows the circuit configuration of the semiconductor integrated circuit device 101. The semiconductor integrated circuit device 101 includes a logic circuit 111 and a substrate bias generating circuit 112.

The logic circuit 111 and the substrate bias generating circuit 112 are provided on the same substrate, and the semiconductor integrated circuit device 101 can generate a substrate bias by passing current through the substrate. The substrate is a semiconductor substrate such as a silicon substrate, for example, a bulk semiconductor substrate such as a bulk silicon substrate.

The logic circuit 111 has a logic cell 211 and a fill cell 212.

The logic cell 211 is an inverter in the present embodiment and includes the pMOS transistor 121 and the nMOS transistor 122 which compose a CMOS. The gates (G), sources (S), drains (D), and bodies (B) of the pMOS 121 and the nMOS 122 are shown in FIG. 2. The source of the PMOS 121 and the source of the nMOS 122 are connected to a power supply line VDD serving as a first power supply line and a ground line VSS serving as a second power supply line, respectively. The drain of the pMOS 121 and the drain of the nMOS 122 are connected to a shared output terminal OUT. The body of the pMOS 121 and the body of the nMOS 122 are connected to a substrate bias line Vbp for a PMOS and a substrate bias line Vbn for an nMOS, respectively. The parasitic diodes 123 and 124 are present respectively between SB (source and body) and DB (drain and body) of the pMOS 121. The parasitic diodes 125 and 126 are present respectively between SB and DB of the nMOS 122.

Although the logic cell 211 is an inverter in the present embodiment, the logic cell 211 may have a logic circuit configuration other than an inverter, including a pMOS transistor or an nMOS transistor.

Figure 36:
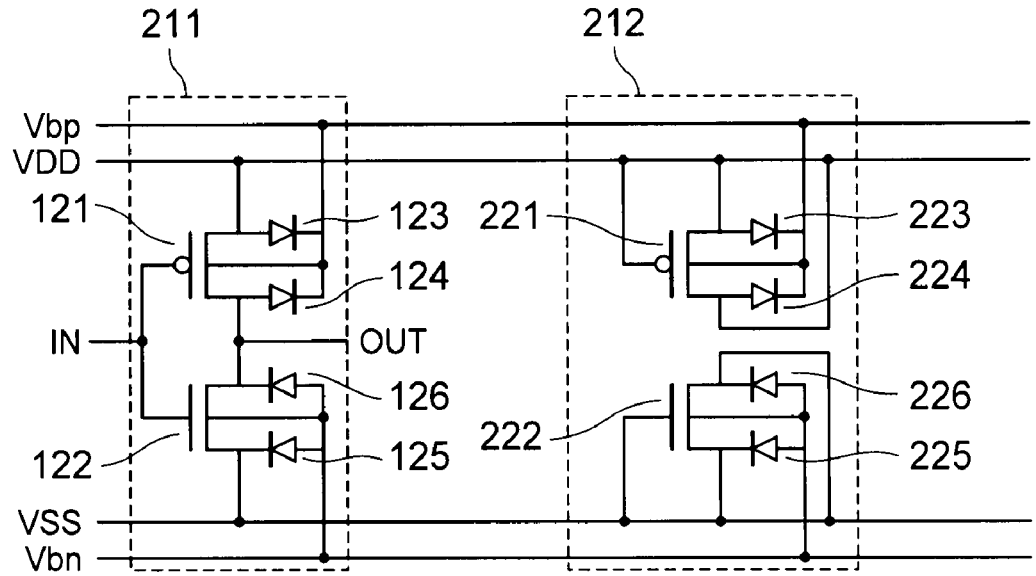
FIG. 36 is a circuit diagram showing a semiconductor integrated circuit device of a fifteenth embodiment.

The fill cell 212 will be specifically described in fifteen and subsequent embodiments (FIG. 36 and subsequent figures).

For explanation, only the logic cell 211 is shown in FIGS. 6, 7, 14, 16 and 18.

The substrate bias generating circuit 112 includes the substrate bias generating circuit 113 for a pMOS and the substrate bias generating circuit 114 for an nMOS. The substrate bias generating circuit 113 for a pMOS includes, as MOS transistors, the current source transistor 131, a switch transistor 132, and a switch transistor 133. The substrate bias generating circuit 114 for an nMOS includes, as MOS transistors, the current source transistor 141, a switch transistor 142, and a switch transistor 143. The gates (G), sources (S), drains (D), and bodies (B) of the transistors 131, 132, 133, 141, 142 and 143 are shown in FIG. 2.

The current source transistor 131 is a current source transistor for a pMOS and generates the substrate current Ibp for a pMOS. When the substrate current Ibp passes through the body of the pMOS 121, a substrate bias is generated on the pMOS 121. The substrate bias is a voltage generated by passing the substrate current Ibp through the parasitic diodes 123 and 124.

On the other hand, the current source transistor 141 is a current source transistor for an nMOS and generates the substrate current Ibn for an nMOS. When the substrate current Ibn passes through the body of the nMOS 122, a substrate bias is generated on the nMOS 122. The substrate bias is a voltage generated by passing the substrate current Ibn through the parasitic diodes 125 and 126.

The gates of the current source transistors 131 and 141 are connected to the power supply line VDD and the ground line VSS, respectively. The sources of the current source transistors 131 and 141 are connected to the drains of the switch transistors 133 and 143, respectively. The drains of the current source transistors 131 and 141 are respectively connected to the substrate bias lines Vbp and Vbn for the substrate biases generated by the substrate currents Ibp and Ibn and output the substrate currents Ibp and Ibn. The bodies of the current source transistors 131 and 141 are respectively connected to the substrate bias lines Vbn and Vbp and may be connected to the ground line VSS and the power supply line VDD when the logic circuit 111 and a well are separated from each other.

The switch transistor 132 is a switch transistor for a pMOS and switches on/off the substrate bias for a pMOS in response to a control signal Cbp for a pMOS.

The switch transistor 142 is a switch transistor for an nMOS and switches on/off the substrate bias for an nMOS in response to a control signal Cbn for an nMOS.

Figure 35:
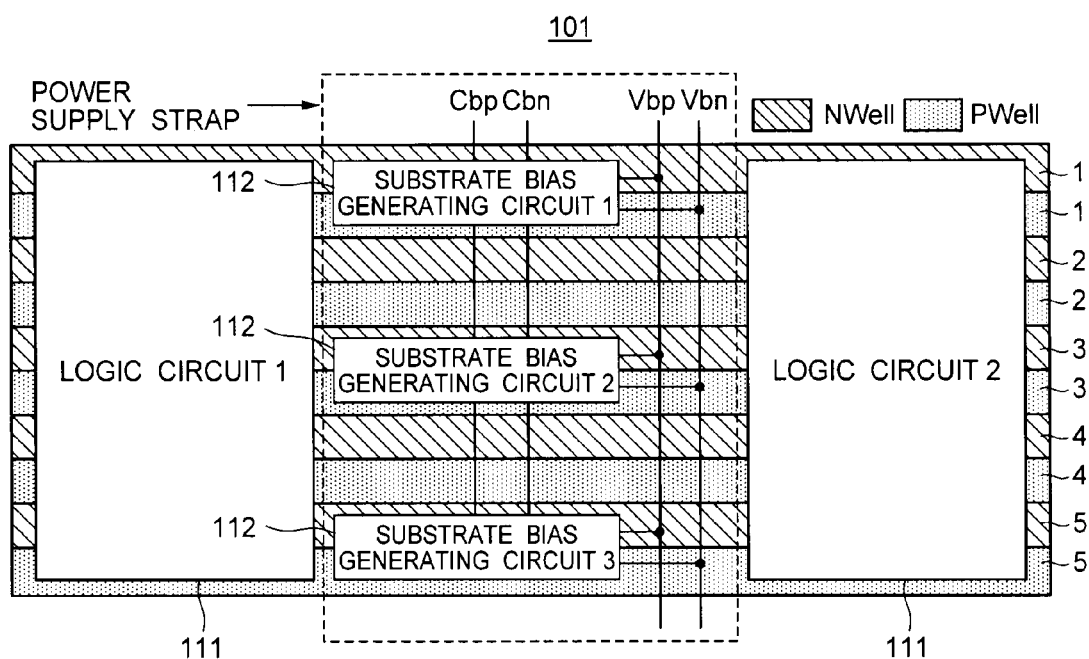
FIG. 35 is a circuit diagram showing a semiconductor integrated circuit device of a fourteenth embodiment.

The control signals Cbp and Cbn are respectively inputted to the gates of the switch transistors 132 and 142. The sources of the switch transistors 132 and 142 are connected to the power supply line VDD and the ground line VSS, respectively. The drains of the switch transistors 132 and 142 are connected to the substrate bias lines Vbp and Vbn, respectively. The bodies of the switch transistors 132 and 142 are respectively connected to the substrate bias lines Vbp and Vbn and may be connected to the power supply line VDD and the ground line VSS when a well having the switch transistors 132 and 142 formed thereon and a well having the logic circuit 111 formed thereon are separated from each other (the wells are shown in FIG. 35).

The switch transistor 133 is a switch transistor for the current source transistor 131. The switch transistor 133 is connected in series with the current source transistor 131 and switches on/off the current source transistor 131 in response to the control signal Cbp for a PMOS.

The switch transistor 143 is a switch transistor for the current source transistor 141. The switch transistor 143 is connected in series with the current source transistor 141 and switches on/off the current source transistor 141 in response to the control signal Cbn for an nMOS.

The control signals Cbp and Cbn are inputted to the gates of the switch transistors 133 and 143, respectively. The sources of the switch transistors 133 and 143 are connected to the ground line VSS and the power supply line VDD, respectively. The drains of the switch transistors 133 and 143 are connected to the sources of the current source transistors 131 and 141, respectively. The bodies of the switch transistors 133 and 143 are respectively connected to the substrate bias lines Vbn and Vbp and may be connected to the ground line VSS and the power supply line VDD when the logic circuit 111 and the well are separated from each other.

When the control signal Cbp for a pMOS is turned on (High), the switch transistor 132 is turned off, the switch transistor 133 is turned on, and the switch transistor 133 brings the current source transistor 131 into a conducting state. In other words, a substrate predetermined current passes through the pMOS. Thus the substrate current Ibp is generated from the current source transistor 131 and the substrate bias voltage Vbp falls below the value of VDD (the substrate bias is on).

On the other hand, when the control signal Cbp for a pMOS is turned off (Low), the switch transistor 132 is turned on, the switch transistor 133 is turned off, and the switch transistor 133 brings the current source transistor 131 into a non-conducting state. In other words, the predetermined current does not pass through a PMOS. Thus the substrate bias line for a pMOS and the power supply line are at the same potential and the substrate bias voltage Vbp is equal to VDD, that is, a zero bias (the substrate bias is off).

When the control signal Cbn for an nMOS is turned on (Low), the switch transistor 142 is turned off, the switch transistor 143 is turned on, and the switch transistor 143 brings the current source transistor 141 into a conducting state. In other words, the predetermined current passes through an nMOS. Thus the substrate current Ibn is generated from the current source transistor 141 and the substrate bias voltage Vbn exceeds the value of VSS (the substrate bias is on).

On the other hand, when the control signal Cbn for an nMOS is turned off (High), the switch transistor 142 is turned on, the switch transistor 143 is turned off, and the switch transistor 143 brings the current source transistor 141 into a non-conducting state. In other words, the predetermined current does not pass through an nMOS. Thus the substrate bias line for an nMOS and the ground line are at the same potential and the substrate bias voltage Vbn is equal to the value of VSS, that is, a zero bias (the substrate bias is off).

Figure 3:
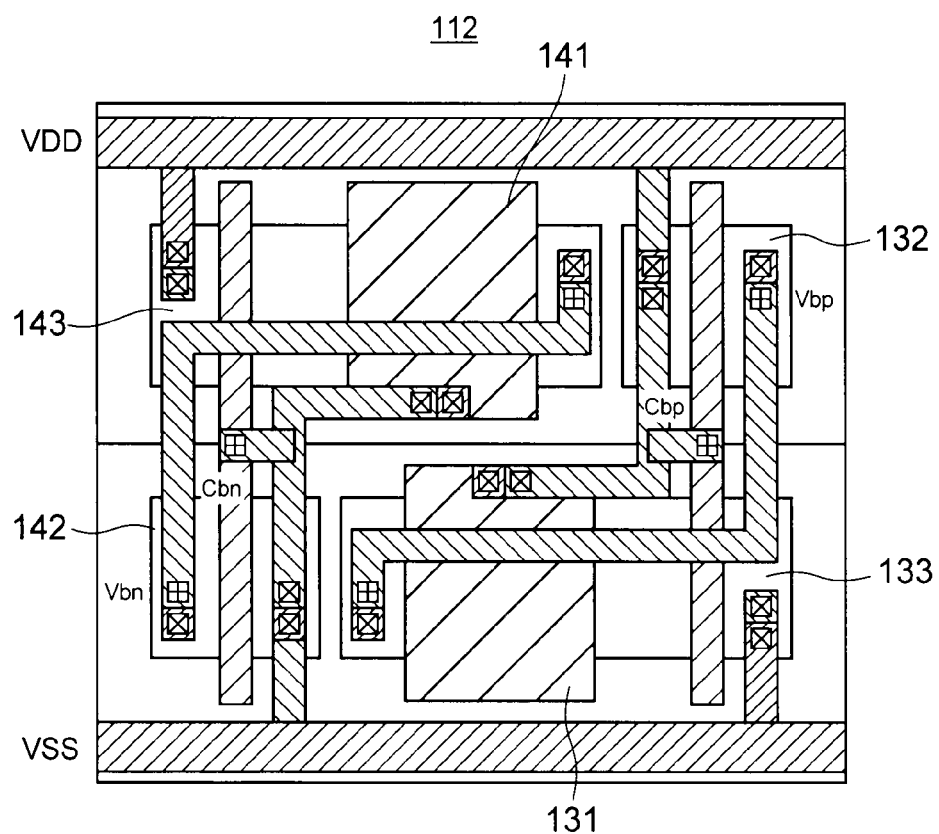
FIG. 3 shows an example of the wiring layout of the substrate bias generating circuit according to the first embodiment.

FIG. 3 shows an example of the wiring layout of the substrate bias generating circuit 112 according to the first embodiment.

FIG. 3 shows an example of the layout of the power supply line VDD, the ground line VSS, the substrate bias line Vbp for a pMOS, the substrate bias line Vbn for an nMOS, the control signal line Cbp for a pMOS, and the control signal line Cbn for an nMOS.

FIG. 3 further shows an example of the layout of the current source transistor 131 for a pMOS, the switch transistor 132 for a pMOS, the switch transistor 133 for a pMOS, the current source transistor 141 for an nMOS, the switch transistor 142 for an nMOS, and the switch transistor 143 for an nMOS.

As shown in FIG. 3, the gate length of the current source transistor 131 for a pMOS is longer than the gate length of the switch transistor 133 for a pMOS. Therefore, the current source transistor 131 for a pMOS can achieve higher accuracy of machining in a manufacturing process as compared with the switch transistor 133 for a PMOS, thereby reducing variations in the manufacturing process.

Further, the switching operation of the switch transistor 133 for a pMOS is faster than the switching operation of the current source transistor 131 for a PMOS, thereby increasing the speed of the controlling operation of the substrate bias current.

Similarly, as shown in FIG. 3, the gate length of the current source transistor 141 for an nMOS is longer than the gate length of the switch transistor 143 for an nMOS. Therefore, the current source transistor 141 for an nMOS can achieve higher accuracy of machining in the manufacturing process as compared with the switch transistor 143 for an nMOS, thereby reducing variations in the manufacturing process.

Further, the switching operation of the switch transistor 143 for an nMOS is faster than the switching operation of the current source transistor 141 for an nMOS, thereby increasing the speed of the controlling operation of the substrate bias current.

Although the gate length of the current source transistor 131 for a pMOS is longer than the gate length of the switch transistor 133 for a pMOS in the present embodiment, the gate width of the current source transistor 131 for a pMOS may be smaller than the gate width of the switch transistor 133 for a pMOS. Similarly, the gate width of the current source transistor 141 for an nMOS may be smaller than the gate width of the switch transistor 143 for an nMOS.

Figure 4:
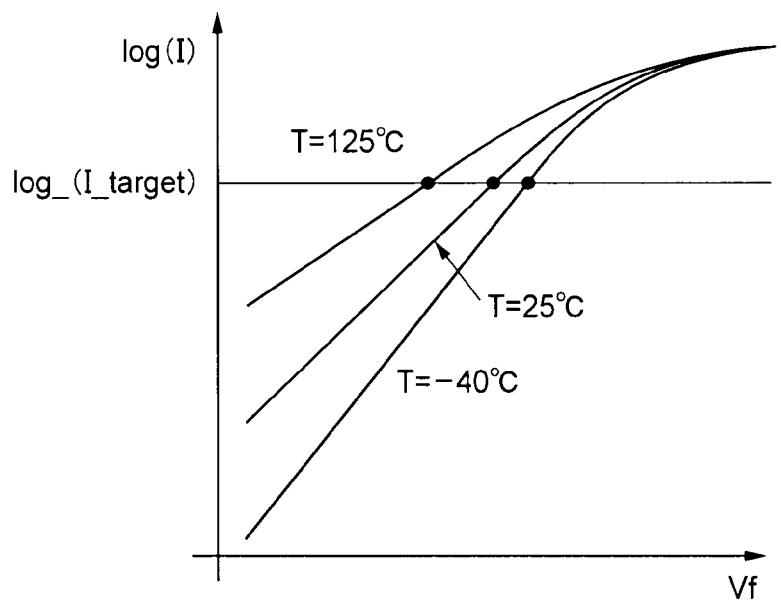
FIG. 4 shows the diode characteristics of the parasitic diodes.

FIG. 4 shows the diode characteristics of the parasitic diodes 123 to 126.

As shown in FIG. 4, a current I passing through the parasitic diodes 123 to 126 exponentially increases with a forward bias voltage Vf. The forward bias voltage Vf is fixed at a value proportional to the substrate currents Ibp and Ibn.

When the forward bias voltage Vf is applied to the MOS transistors 121 and 122, threshold voltages Vth of the MOS transistors 121 and 122 decrease and the operating rates of the MOS transistors 121 and 122 increase.

As shown in FIG. 4, the current I passing through the parasitic diodes 123 to 126 increases with temperatures.

The semiconductor integrated circuit device 101 of the present embodiment includes the current source transistor 131, the current source transistor 141, the switch transistors 132 and 142, and the switch transistors 133 and 143 as transistors for generating the substrate bias by passing current through the substrate.

Further, the gates of the current source transistors 131 and 141 are not connected to control signal lines Cbp and Cbn but are connected to the power supply line VDD and the ground line VSS.

With this configuration, the current source transistors 131 and 141 are not fed with the control signals Cbp and Cbn relatively susceptible to noise but are fed with a power supply potential VDD and a ground potential VSS which are relatively unsusceptible to noise. Thus the amounts of the substrate currents Ibp and Ibn are stabilized and the voltage values of the substrate bias line Vbp and Vbn are fixed. The gates of the switch transistors 132 and 142 and the gates of the switch transistors 133 and 143 are connected to the control signal lines Cbp and Cbn, respectively.

Figure 5:
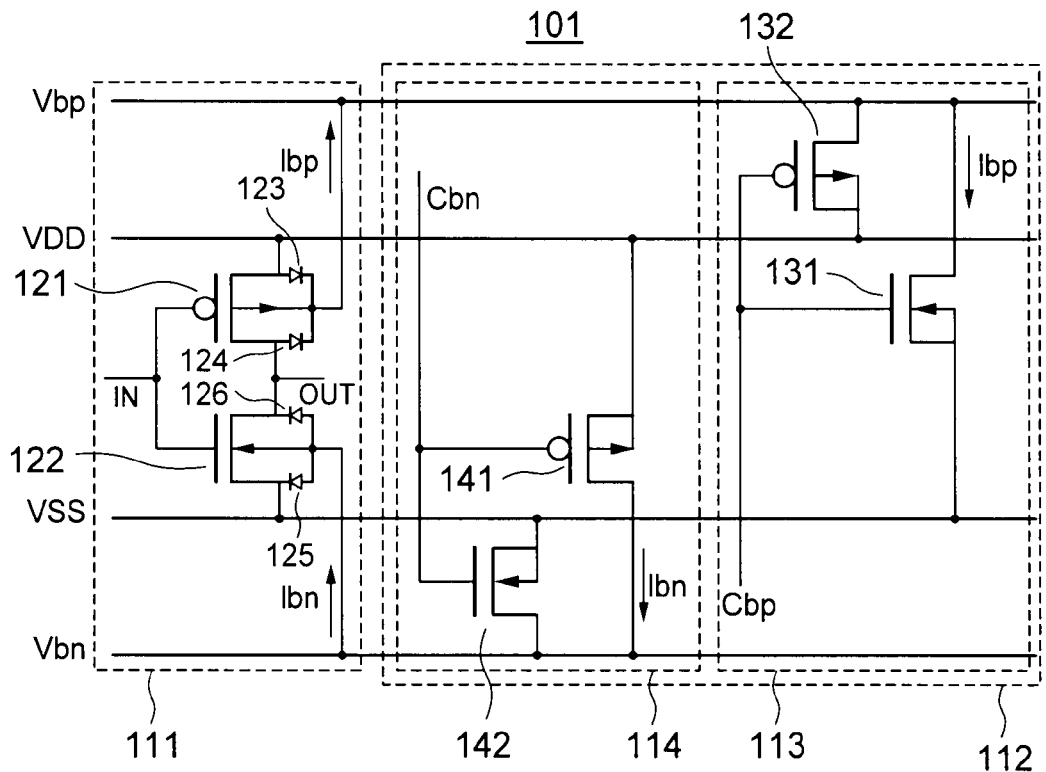
FIG. 5 is a circuit diagram showing a semiconductor integrated circuit device 101 of the comparative example.

The following is a comparison between the embodiment shown in FIG. 2 and a comparative example shown in FIG. 5. FIG. 5 is a circuit diagram showing a semiconductor integrated circuit device 101 of the comparative example. The semiconductor integrated circuit device 101 of the comparative example includes current source transistors 131 and 141 and switch transistors 132 and 142 but does not include switch transistors 133 and 143. The gates of the current source transistors 131 and 141 are connected to control signal lines Cbp and Cbn, respectively, and the gates of the switch transistors 132 and 142 are connected to the control signal lines Cbp and Cbn, respectively.

Thus the comparison between the embodiment of FIG. 2 and the comparative example of FIG. 5 proves that the inputs of the current source transistors 131 and 141 are less susceptible to noise in the embodiment of FIG. 2 and the inputs of the current source transistors 131 and 141 are more susceptible to noise in the comparative example of FIG. 5.

For this reason, the present embodiment can more stabilize the amounts of the substrate currents Ibp and Ibn and fix the voltage values of the substrate bias lines Vbp and Vbn.

The substrate bias generating circuit 112 of the present embodiment includes the substrate bias generating circuit 113 for a PMOS and the substrate bias generating circuit 114 for an nMOS. The substrate bias generating circuit 112 may include only one of the substrate bias generating circuit 113 for a pMOS and the substrate bias generating circuit 114 for an nMOS.

One of the pMOS transistor 121 and the nMOS transistor 122 corresponds to an example of a transistor of a first conductivity type and the other corresponds to an example of a transistor of a second conductivity type.

The following is various modifications of the present embodiment. Differences between the modifications and the present embodiment will be mainly described below.

Second Embodiment

Figure 6:
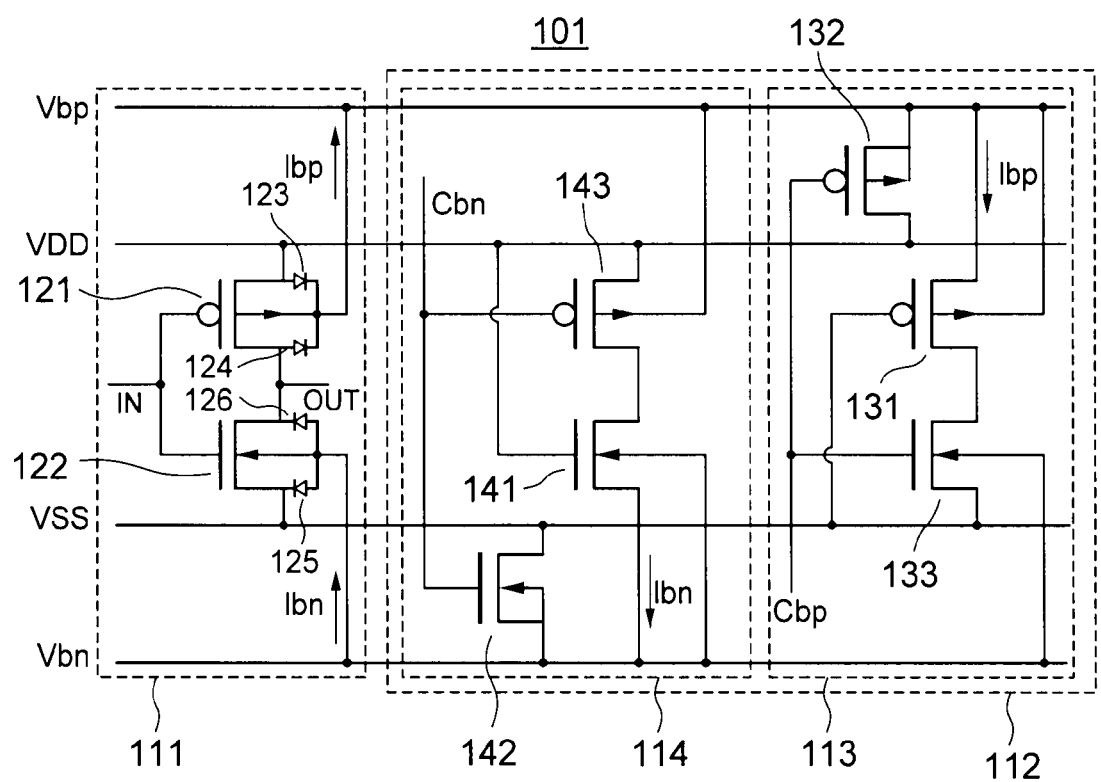
FIG. 6 is a circuit diagram showing a semiconductor integrated circuit device 101 of a second embodiment.

FIG. 6 is a circuit diagram showing a semiconductor integrated circuit device 101 of a second embodiment. The semiconductor integrated circuit device 101 includes a logic circuit 111 and a substrate bias generating circuit 112. As described above, the logic circuit 111 has a logic cell 211 and a fill cell 212. For explanation, only the logic cell 211 is shown in FIG. 6. The substrate bias generating circuit 112 includes a substrate bias generating circuit 113 for a pMOS and a substrate bias generating circuit 114 for an nMOS. The side sectional view of the semiconductor integrated circuit device 101 is identical to that of FIG. 1.

In the first embodiment, the current source transistors 131 and 141 are provided for an nMOS and a pMOS, respectively, whereas in the second embodiment, current source transistors 131 and 141 are provided for a pMOS and an nMOS, respectively.

Further, in the first embodiment, the sources of the current source transistors 131 and 141 are connected to the power supply line VDD and the ground line VSS, respectively, whereas in the second embodiment, the sources of the current source transistors 131 and 141 are connected to a ground line VSS and a power supply line VDD, respectively.

Moreover, in the first embodiment, the bodies of the current source transistors 131 and 141 are connected to the substrate bias lines Vbn and Vbp, respectively, whereas in the second embodiment, the bodies of the current source transistors 131 and 141 are connected to substrate bias lines Vbp and Vbn, respectively. When the logic circuit 111 and a well are separated from each other, the bodies of the current source transistors 131 and 141 may be connected to the power supply line VDD and the ground line VSS, respectively.

As shown in FIG. 4, a current passing through parasitic diodes 123 to 126 at a low temperature is quite smaller than a current applied at a high temperature.

In the first embodiment, a current passing through the current source transistors 131 and 141 at a low temperature is substantially equal to a current applied at a high temperature and thus the substrate bias voltages Vbp and Vbn rapidly increase at low temperatures.

However, in the second embodiment, as substrate bias voltages Vbp and Vbn increase, gate voltages applied to the current source transistors 131 and 141 decrease and currents passing through the current source transistors 131 and 141 also decrease. Thus it is possible to suppress an increase in the substrate bias voltages Vbp and Vbn. Such an operation is enabled in the second embodiment because the source potentials of the current source transistors 131 and 141 are equal to substrate bias potentials Vbp and Vbn.

As described above, in the second embodiment, the current source transistors 131 and 141 are respectively current sources for passing current between VSS and VDD and between Vbp and Vbn, are respectively provided for a pMOS and an nMOS, and have the gates connected to VSS and VDD, and switch transistors 133 and 143 are provided for an nMOS and a pMOS, respectively. When Vbp and Vbn increase, the actions of the current source transistors 131 and 141 reduce the gate voltages applied to the current source transistors 131 and 141 and the currents passing through the current source transistors 131 and 141, thereby suppressing an excessive increase of Vbp and Vbn.

Third Embodiment

Figure 7:
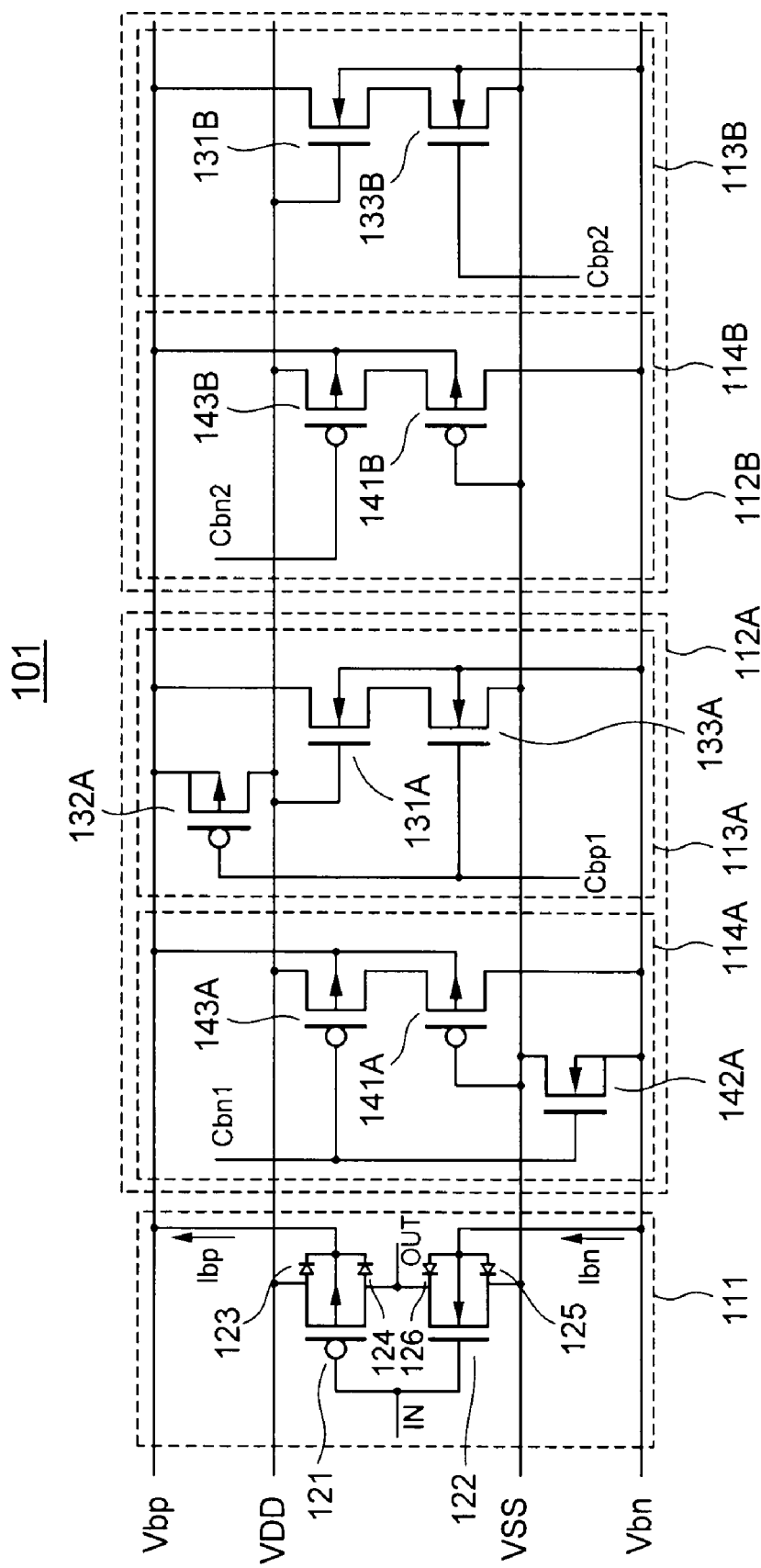
FIG. 7 is a circuit diagram showing a semiconductor integrated circuit device 101 of a third embodiment.

FIG. 7 is a circuit diagram showing a semiconductor integrated circuit device 101 of a third embodiment. The semiconductor integrated circuit device 101 includes a logic circuit 111, a first substrate bias generating circuit 112A, and a second substrate bias generating circuit 112B. As described above, the logic circuit 111 has a logic cell 211 and a fill cell 212. For explanation, only the logic cell 211 is shown in FIG. 7.

The first substrate bias generating circuit 112A includes a first substrate bias generating circuit 113A for a pMOS and a first substrate bias generating circuit 114A for an nMOS. The second substrate bias generating circuit 112B includes a second substrate bias generating circuit 113B for a pMOS and a second substrate bias generating circuit 114B for an nMOS.

The first substrate bias generating circuit 112A is identical in circuit configuration to the substrate bias generating circuit 112 of the first embodiment. On the other hand, the second substrate bias generating circuit 112B is configured such that the switch transistors 132 and 142 are omitted from the substrate bias generating circuit 112 of the first embodiment.

In FIG. 7, the reference numerals of transistors composing the first substrate bias generating circuit 112A have subscripts "A" and the reference numerals of the transistors composing the second substrate bias generating circuit 112B have subscripts "B".

In the first substrate bias generating circuit 112A, the gates of switch transistors 132A and 133A are fed with a first control signal Cbp1 for a PMOS. The gates of switch transistors 142A and 143A are fed with a first control signal Cbn1 for an nMOS.

In the second substrate bias generating circuit 112B, the gate of a switch transistor 133B is fed with a second control signal Cbp2 for a pMOS. The gate of a switch transistor 143B is fed with a second control signal Cbn2 for an nMOS.

In the third embodiment, a substrate bias can be switched on/off by the first control signals Cbp1 and Cbn1. A substrate bias for a PMOS is switched on/off by the control signal Cbp1 for a pMOS and a substrate bias for an nMOS is switched on/off by the control signal Cbn1 for an nMOS.

Further, in the third embodiment, the amounts of substrate currents can be changed by the second control signals Cbp2 and Cbn2. When only the first control signal is turned on, only the current source transistor of the first bias generating circuit is turned on. When the first and second control signals are turned on, the current source transistors of the first and second bias generating circuits are turned on. The amount of substrate current for a pMOS is changed by the control signal Cbp2 for a pMOS and the amount of substrate current for an nMOS is changed by the control signal Cbn2 for an nMOS.

As described above, in the third embodiment, the amount of substrate current can be changed. Therefore, in the third embodiment, substrate biases Vbp and Vbn not only can be switched on/off but also can be varied in voltage value.

In this configuration, current source transistors 131A and 131B are nMOS transistors having the same configuration and current source transistors 141A and 141B are pMOS transistors having the same configuration. Thus when the current source transistors 131A and 131B are both turned on, the amount of substrate current for a pMOS is twice as large as a current amount obtained when only the current source transistor 131A is turned on. When the current source transistors 141A and 141B are both turned on, the amount of substrate current for an nMOS is twice as large as a current amount obtained when only the current source transistor 141A is turned on.

In the third embodiment, the first substrate bias generating circuit 112A includes the switch transistors 132 and 142 but the second substrate bias generating circuit 112B does not include the switch transistors 132 and 142. This is because the switch transistors 132 and 142 are switch transistors for controlling a zero bias and it is enough to provide one of the transistors 132 and one of the transistors 142.

Figures 8A, 8B, 9:
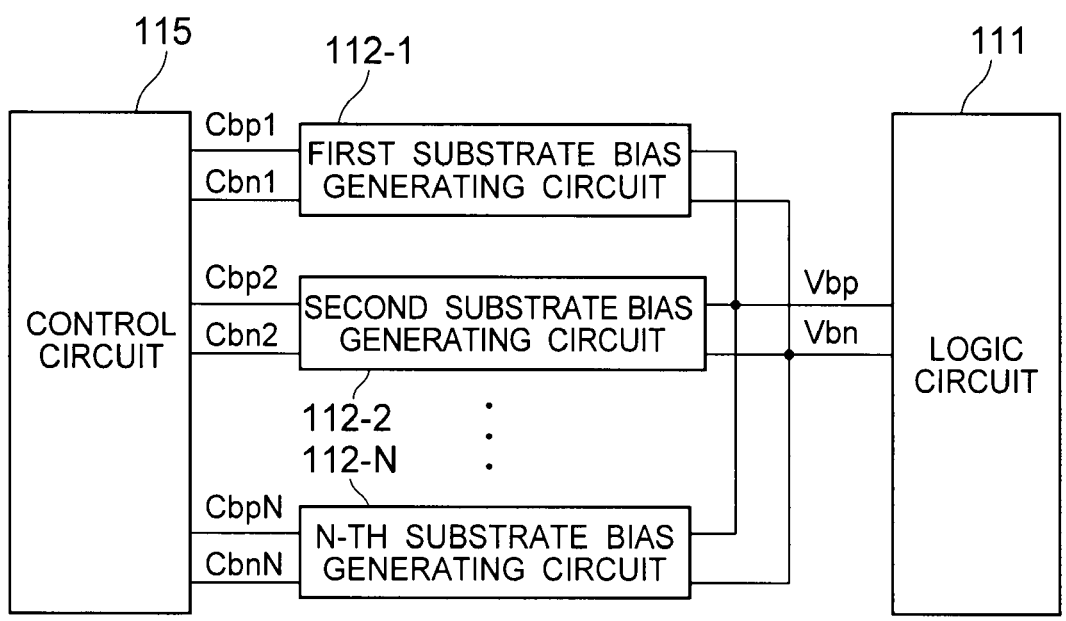
FIG. 8A shows the relationship between the control signals Cbp1 and Cbp2 and the substrate bias Vbp.
FIG. 8B shows the relationship between the control signals Cbn1 and Cbn2 and the substrate bias Vbn.
FIG. 9 is a circuit diagram showing the semiconductor integrated circuit device including "N" substrate bias generating circuits.

FIG. 8A shows the relationship between the control signals Cbp1 and Cbp2 and the substrate bias Vbp and FIG. 8B shows the relationship between the control signals Cbn1 and Cbn2 and the substrate bias Vbn.

As shown in FIG. 8A, when the control signals Cbp1 and Cbp2 are L, the substrate bias Vbp is VDD (0 bias).

When the control signals Cbp1 and Cbp2 are H and L, respectively, the substrate bias Vbp has a first voltage value Vbp1 which corresponds to a substrate bias obtained when the current source transistor 131A is turned on and the current source transistor 131B is turned off.

When the control signals Cbp1 and Cbp2 are H, the substrate bias Vbp has a second voltage value Vbp2 which corresponds to a substrate bias obtained when the current source transistors 131A and 131B are both turned on. In this case, VDD>Vbp1>Vbp2>VSS is satisfied.

As shown in FIG. 8, when the control signals Cbn1 and Cbn2 are H, the substrate bias Vbn is VSS (0 bias).

When the control signals Cbn1 and Cbn2 are L and H, respectively, the substrate bias Vbn has a first voltage value Vbn1 which corresponds to a substrate bias obtained when the current source transistor 141A is turned on and the current source transistor 141B is turned off.

When the control signals Cbn1 and Cbn2 are L, the substrate bias Vbn has a second voltage value Vbn2 which corresponds to a substrate bias obtained when the current source transistors 141A and 141B are both turned on. In this case, VSS<Vbn1<Vbn2<VDD is satisfied.

The semiconductor integrated circuit device 101 of the third embodiment includes the two substrate bias generating circuits 112 and may include three or more substrate bias generating circuits 112 according to a desired current value.

FIG. 9 is a circuit diagram showing the semiconductor integrated circuit device 101 including "N" substrate bias generating circuits 112. "N" represents an integer not smaller than 3.

The semiconductor integrated circuit device 101 of FIG. 9 includes the logic circuit 111, the first to N-th substrate bias generating circuits 112-1, 2, . . . N, and a control circuit 115.

The first substrate bias generating circuit 112-1 is identical in circuit configuration to the substrate bias generating circuit 112 of the first embodiment and the substrate bias generating circuit 112A of FIG. 7.

On the other hand, the second to N-th substrate bias generating circuits 112-2, . . . N are configured such that the switch transistors 132 and 142 are omitted from the substrate bias generating circuit 112 of the first embodiment. The second to N-th substrate bias generating circuits 112-2, . . . N are identical in circuit configuration to the substrate bias generating circuit 112B of FIG. 7.

In the embodiment of FIG. 9, the first to N-th control signals Cbp1, 2, . . . N for a pMOS are outputted from the control circuit 115 and are inputted to the first to N-th substrate bias generating circuits 112-1, 2, . . . N. Similarly, the first to N-th control signals Cbn1, 2, . . . N for an nMOS are outputted from the control circuit 115 and are inputted to the first to N-th substrate bias generating circuits 112-1, 2, . . . and N.

Further, in the embodiment of FIG. 9, the substrate bias can be switched on/off by the first control signals Cbp1 and Cbn1. Moreover, the amount of substrate current can be changed by the second to N-th control signals Cbp2, . . . N and Cbn2 . . . N.

Thus in the embodiment of FIG. 9, it is possible to minutely change the amount of substrate current and the voltage values of the substrate biases Vbp and Vbn.

Fourth Embodiment

Figures 10, 11A, 11B:
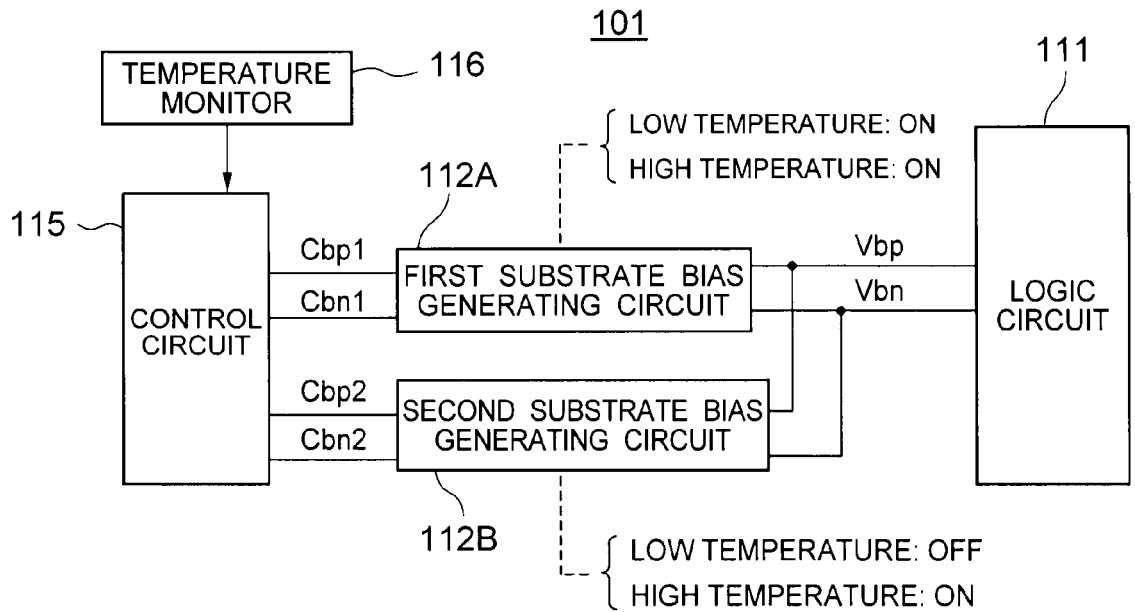
FIG. 10 is a circuit diagram showing a semiconductor integrated circuit device of a fourth embodiment.
FIG. 11A shows the relationship between operation modes and control signals Cbp1 and Cbp2.
FIG. 11B shows the relationship between the operation modes and control signals Cbn1 and Cbn2.

FIG. 10 is a circuit diagram showing a semiconductor integrated circuit device 101 of a fourth embodiment. The semiconductor integrated circuit device 101 includes a logic circuit 111, a first substrate bias generating circuit 112A, a second substrate bias generating circuit 112B, a control circuit 115, and a temperature monitor 116.

The first substrate bias generating circuit 112A is identical in circuit configuration to the first substrate bias generating circuit 112A of FIG. 7. Similarly, the second substrate bias generating circuit 112B is identical in circuit configuration to the second substrate bias generating circuit 112B of FIG. 7.

In the present embodiment, the temperature monitor 116 is mounted on the control circuit 115 and a temperature measurement result is provided from the temperature monitor 116 to the control circuit 115. The control circuit 115 changes the amount of substrate current according to the temperature measurement result.

In the present embodiment, the control circuit 115 operates the first and second substrate bias generating circuits 112A and 112B at high temperatures to pass a large amount of substrate current, and operates only the first substrate bias generating circuit 112A at low temperatures to suppress the substrate current.

Thus in the present embodiment, it is possible to suppress an increase of substrate bias voltages Vbp and Vbn at low temperatures.

The semiconductor integrated circuit device 101 of the present embodiment may include three or more substrate bias generating circuits 112 as shown in FIG. 9. This configuration makes it possible to respond to more minute temperature changes with more minute current control.

FIG. 11A shows the relationship between operation modes and control signals Cbp1 and Cbp2. FIG. 11B shows the relationship between the operation modes and control signals Cbn1 and Cbn2.

As shown in FIG. 11A, in standby mode, the control signals Cbp1 and Cbp2 are set at L. In low-temperature operation mode, the control signals Cbp1 and Cbp2 are set at H and L, respectively. In high-temperature operation mode, the control signals Cbp1 and Cbp2 are set at H.

As shown in FIG. 11B, in standby mode, the control signals Cbn1 and Cbn2 are set at H. In low-temperature operation mode, the control signals Cbn1 and Cbn2 are set at L and H, respectively. In high-temperature operation mode, the control signals Cbn1 and Cbn2 are set at L.

Fifth Embodiment

Figures 12, 13A, 13B:
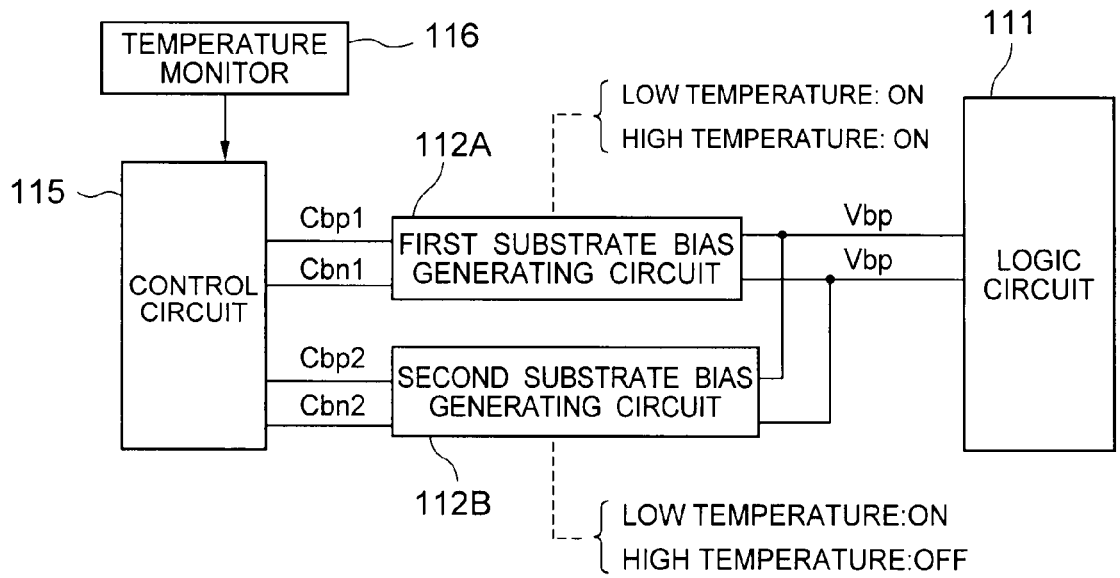
FIG. 12 is a circuit diagram showing a semiconductor integrated circuit device 101 of a fifth embodiment.
FIG. 13A shows the relationship between operation modes and control signals Cbp1 and Cbp2.
FIG. 13B shows the relationship between the operation modes and control signals Cbn1 and Cbn2.

FIG. 12 is a circuit diagram showing a semiconductor integrated circuit device 101 of a fifth embodiment.

The semiconductor integrated circuit device 101 includes a logic circuit 111, a first substrate bias generating circuit 112A, a second substrate bias generating circuit 112B, a control circuit 115, and a temperature monitor 116.

The first substrate bias generating circuit 112A is identical in circuit configuration to the first substrate bias generating circuit 112A of FIG. 7. Similarly, the second substrate bias generating circuit 112B is identical in circuit configuration to the second substrate bias generating circuit 112B of FIG. 7.

In the present embodiment, the temperature monitor 116 is mounted on the control circuit 115 and a temperature measurement result is provided from the temperature monitor 116 to the control circuit 115. The control circuit 115 changes the amount of substrate current according to the temperature measurement result.

Contrary to the control circuit 115 of the fourth embodiment, the control circuit 115 of the fifth embodiment operates the first and second substrate bias generating circuits 112A and 112B at low temperatures to pass a large amount of substrate current, and operates only the first substrate bias generating circuit 112A at high temperatures to suppress the substrate current.

Thus in the present embodiment, it is possible to suppress substrate bias voltages Vbp and Vbn at high temperatures and suppress leakage current at high temperatures.

The semiconductor integrated circuit device 101 of the present embodiment may include three or more substrate bias generating circuits 112 as shown in FIG. 9. This configuration makes it possible to respond to more minute temperature changes with more minute current control.

FIG. 13A shows the relationship between operation modes and control signals Cbp1 and Cbp2. FIG. 13B shows the relationship between the operation modes and control signals Cbn1 and Cbn2.

As shown in FIG. 13A, in standby mode, the control signals Cbp1 and Cbp2 are set at L. In low-temperature operation mode, the control signals Cbp1 and Cbp2 are set at H. In high-temperature operation mode, the control signals Cbp1 and Cbp2 are set at H and L, respectively.

As shown in FIG. 13B, in standby mode, the control signals Cbn1 and Cbn2 are set at H. In low-temperature operation mode, the control signals Cbn1 and Cbn2 are set at L. In high-temperature operation mode, the control signals Cbn1 and Cbn2 are set at L and H, respectively.

Sixth Embodiment

Figure 14:
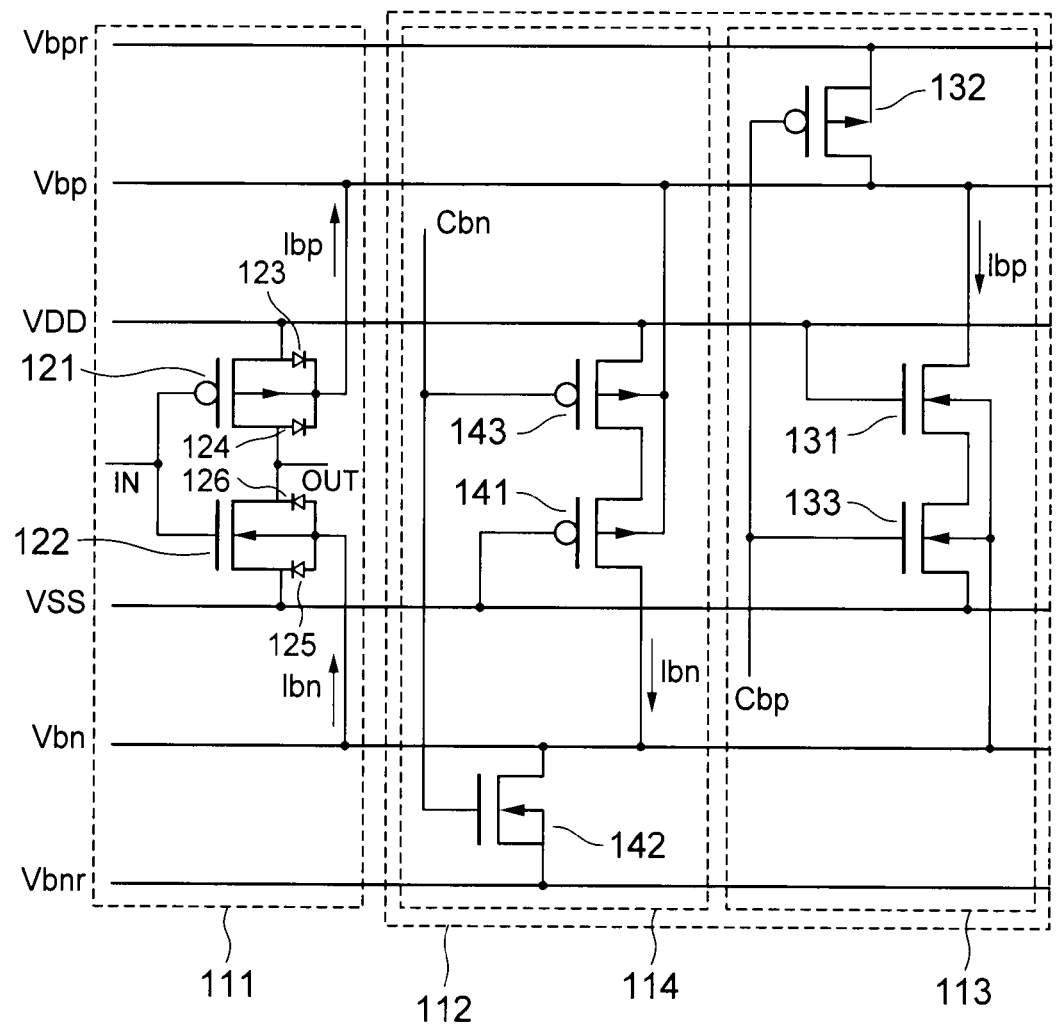
FIG. 14 is a circuit diagram showing a semiconductor integrated circuit device of a sixth embodiment.

FIG. 14 is a circuit diagram showing a semiconductor integrated circuit device 101 of a sixth embodiment.

The semiconductor integrated circuit device 101 includes a logic circuit 111 and a substrate bias generating circuit 112. As described above, the logic circuit 111 has a logic cell 211 and a fill cell 212. For explanation, only the logic cell 211 is shown in FIG. 14.

The substrate bias generating circuit 112 includes a substrate bias generating circuit 113 for a pMOS and a substrate bias generating circuit 114 for an nMOS. The side sectional view of the semiconductor integrated circuit device 101 is identical to that of FIG. 1.

In the first embodiment, the switch transistor 132 has the source connected to VSS and the drain and body connected to Vbn, whereas in the sixth embodiment, a switch transistor 132 has the source and body connected to a third power supply line Vbnr and the drain connected to Vbn.

Further, in the first embodiment, the switch transistor 142 has the source connected to VDD and the drain and body connected to Vbp, whereas in the sixth embodiment, a switch transistor 142 has the source and body connected to a fourth power supply line Vbpr and the drain connected to Vbp.

When a control signal Cbp is L, a substrate bias Vbp becomes a reverse bias Vbpr. When the control signal Cbp is H, the substrate bias Vbp becomes a forward bias Vbpf which corresponds to a substrate bias obtained when the switch transistor 132 is turned off, a switch transistor 133 is turned on, and a current source transistor 131 is turned on. In this case, VSS<Vbpf<VDD<Vbpr is satisfied.

When a control signal Cbn is H, a substrate bias Vbn becomes a reverse bias Vbnr. When the control signal Cbn is L, the substrate bias Vbn becomes a forward bias Vbnf which corresponds to a substrate bias obtained when the switch transistor 142 is turned off, a switch transistor 143 is turned on, and a current source transistor 141 is turned on. In this case, VDD>Vbnf>VSS>Vbnr is satisfied.

Seventh Embodiment

Figure 15:
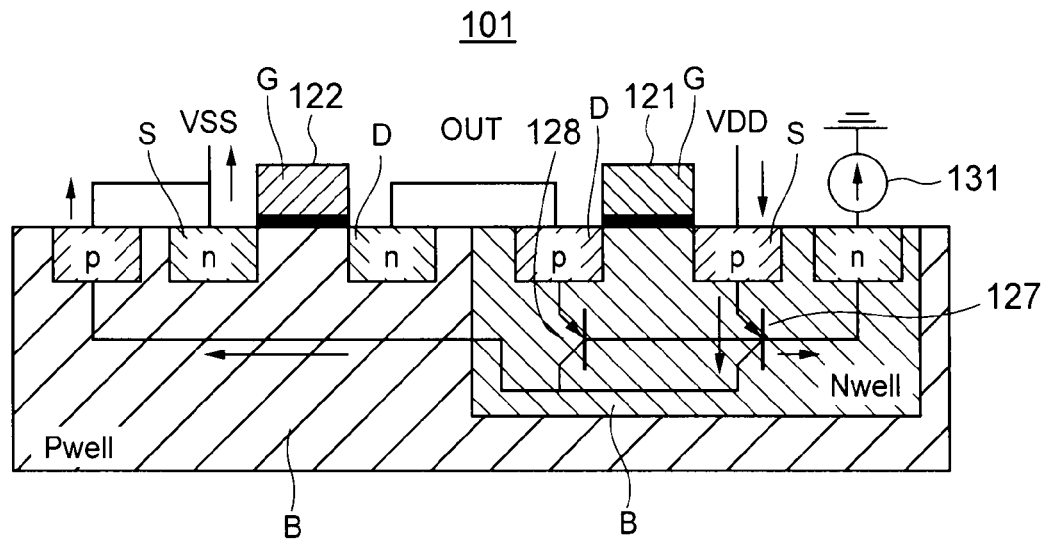
FIG. 15 is a side sectional view showing a semiconductor integrated circuit device of a seventh embodiment.

FIG. 15 is a side sectional view showing a semiconductor integrated circuit device 101 of a seventh embodiment.

In the first embodiment, the semiconductor integrated circuit device 101 includes the current source transistor 131 for a pMOS and the current source transistor 141 for an nMOS, whereas in the seventh embodiment, the semiconductor integrated circuit device 101 includes a current source transistor 131 for a PMOS but does not include a current source transistor 141 for an nMOS. Thus in the seventh embodiment, a pMOS 121 is used by applying a substrate bias and an nMOS 122 is used without applying a substrate bias.

In the present embodiment, a substrate bias is applied to the PMOS 121 but is not applied to the nMOS 122. Thus in the present embodiment, a current passes through the base terminals of parasitic bipolars 127 and 128 between the source and body and between the drain and body of the PMOS 121, whereas a current hardly passes through the base terminals of parasitic bipolars 129 and 130 between the source and body and between the drain and body of the nMOS 122.

Therefore, in the present embodiment, a base current (current passing through the bases of the bipolars) is suppressed and the occurrence of latch up is reduced. Further, the present embodiment does not require a deep N well.

Figure 16:
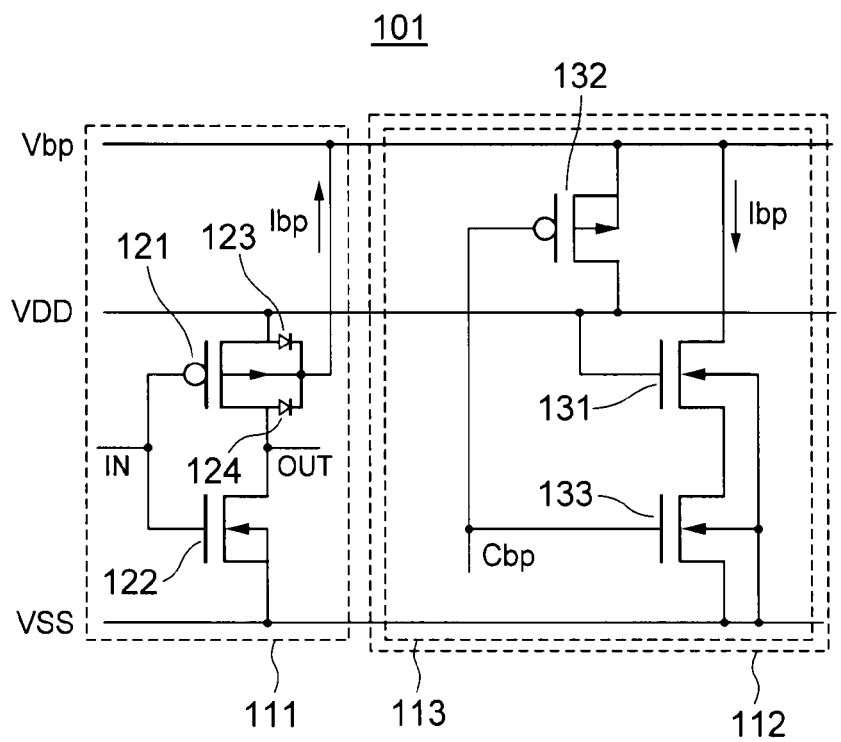
FIG. 16 is a circuit diagram showing the semiconductor integrated circuit device of the seventh embodiment.

FIG. 16 is a circuit diagram showing the semiconductor integrated circuit device 101 of the seventh embodiment.

The semiconductor integrated circuit device 101 includes a logic circuit 111 and a substrate bias generating circuit 112. As described above, the logic circuit 111 has a logic cell 211 and a fill cell 212. For explanation, only the logic cell 211 is shown in FIG. 16.

The substrate bias generating circuit 112 includes a substrate bias generating circuit 113 for a pMOS but does not include a substrate bias generating circuit 114 for an nMOS.

The substrate bias generating circuit 112 of the present embodiment includes the substrate bias generating circuit 113 for a PMOS but does not include the substrate bias generating circuit 114 for an nMOS. The substrate bias generating circuit 112 may include the substrate bias generating circuit 114 for an nMOS without the substrate bias generating circuit 113 for a pMOS. In this case, an nMOS 122 is used by applying a substrate bias and a pMOS 121 is used without applying a substrate bias.

The substrate bias generating circuit 112 of the present embodiment is configured such that the substrate bias generating circuit 114 for an nMOS is omitted from the substrate bias generating circuit 112 of the first embodiment. The substrate bias generating circuit 114 for an nMOS may be omitted from the substrate bias generating circuit 112 of one of the second to sixth embodiments.

Eighth Embodiment

Figure 17:
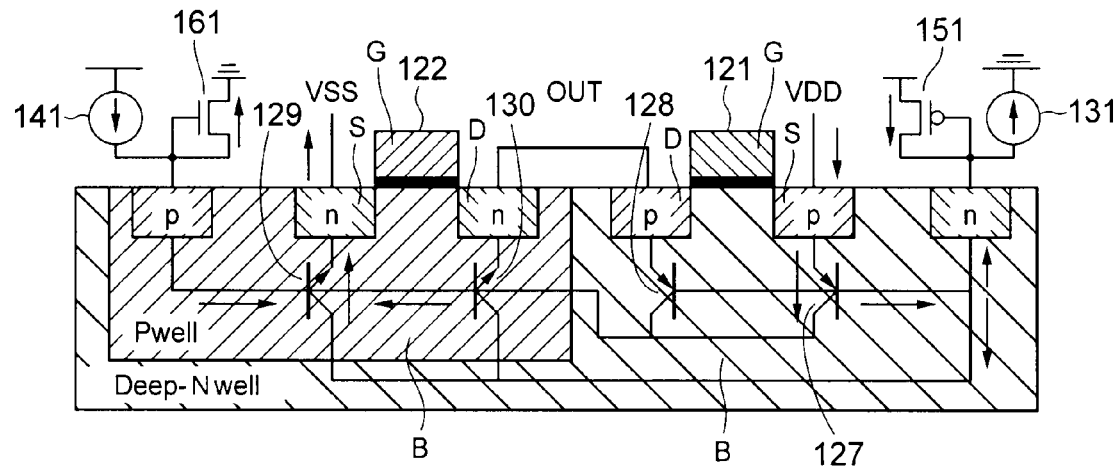
FIG. 17 is a side sectional view showing a semiconductor integrated circuit device of an eighth embodiment.

FIG. 17 is a side sectional view showing a semiconductor integrated circuit device 101 of an eighth embodiment.

The semiconductor integrated circuit device 101 of the eighth embodiment includes a pMOS 121, an nMOS 122, a current source transistor 131 for a pMOS, and a current source transistor 141 for an nMOS as in the semiconductor integrated circuit device 101 of the first embodiment.

Also in the eighth embodiment, a substrate bias Vbp for a pMOS is generated by the current source transistor 131 and a substrate bias Vbn for an nMOS is generated by the current source transistor 141 as in the first embodiment. The pMOS 121 is used by applying the substrate bias Vbp and the nMOS 122 is used by applying the substrate bias Vbn.

The semiconductor integrated circuit device 101 of the eighth embodiment further includes a limiter transistor 151 for a pMOS and a limiter transistor 161 for an nMOS.

Figure 18:
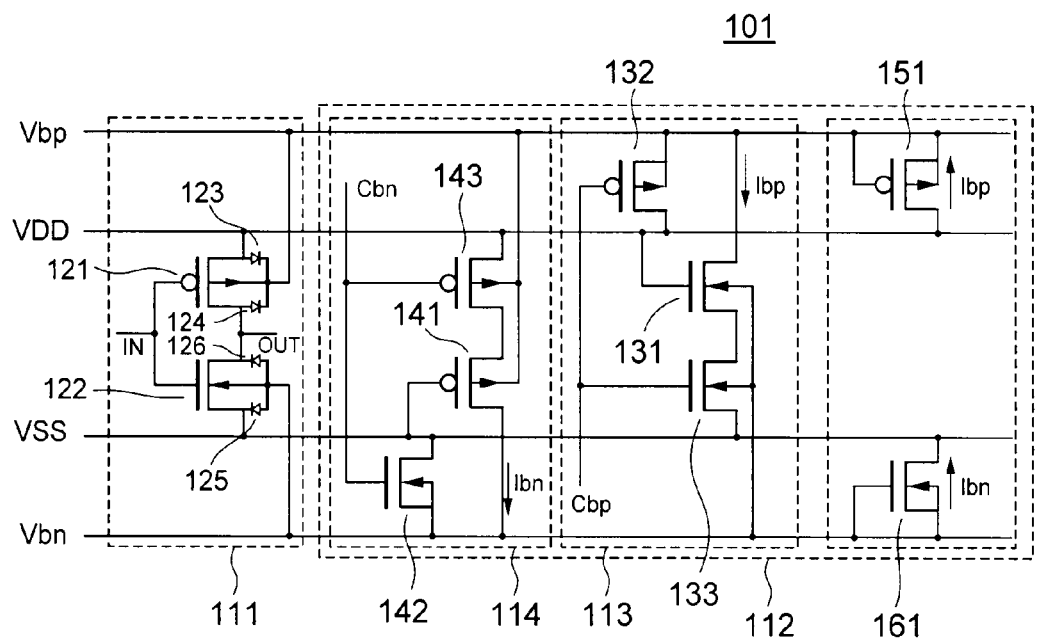
FIG. 18 is a circuit diagram showing the semiconductor integrated circuit device of the eighth embodiment.

The limiter transistor is a transistor for suppressing a voltage amplitude to a set voltage or lower. Referring to FIG. 18, the limiter transistors 151 and 161 will be specifically described below.

FIG. 18 is a circuit diagram showing the semiconductor integrated circuit device 101 of the eighth embodiment.

The semiconductor integrated circuit device 101 includes logic circuit 111 and a substrate bias generating circuit 112. As described above, the logic circuit 111 has a logic cell 211 and a fill cell 212. For explanation, only the logic cell 211 is shown in FIG. 18.

The substrate bias generating circuit 112 includes a substrate bias generating circuit 113 for a pMOS, a substrate bias generating circuit 114 for an nMOS, a limiter transistor 151 for a PMOS, and a limiter transistor 161 for an nMOS.

The limiter transistor 151 is a MOS transistor used as a limiter for a pMOS.

The limiter transistor 161 is a MOS transistor used as a limiter for an nMOS.

The gates of the limiter transistors 151 and 161 are connected to substrate bias lines Vbp and Vbn, respectively.

The sources of the limiter transistors 151 and 161 are connected to a power supply line VDD and a ground line VSS, respectively. The drains of the limiter transistors 151 and 161 are connected to the substrate bias lines Vbp and Vbn, respectively. The bodies of the limiter transistors 151 and 161 are connected to the substrate bias lines Vbp and Vbn, respectively. The voltage values of the substrate bias lines Vbp and Vbn are determined by threshold voltages Vth of the limiter transistors 151 and 161.

In the present embodiment, currents outputted from the current source transistors 131 and 141 mainly pass through the limiter transistors 151 and 161, respectively, so that a base current (current passing through the bases of bipolars) is suppressed and latch up can be avoided.

The substrate bias generating circuit 112 of the present embodiment includes the single limiter transistor 151 for a PMOS and the single limiter transistor 161 for an nMOS. The substrate bias generating circuit 112 may include two or more limiter transistors 151 for a pMOS and two or more limiter transistors 161 for an nMOS.

Ninth Embodiment

FIG. 19 is a circuit diagram showing a semiconductor integrated circuit device 101 of a ninth embodiment.

FIG. 19 shows the logic circuit 111 and the substrate bias generating circuit 112 of one of the first to third embodiments. FIG. 19 further shows a control circuit 115 for outputting a control signal Cb. The control signal Cb of FIG. 19 indicates a control signal Cbn or Cbp. FIG. 19 further shows a substrate bias Vb. The substrate bias Vb of FIG. 19 indicates a substrate bias Vbn or Vbp.

The detail of Cb and Vb will be described below. The following explanation of Cb and Vb may be applied only to Cbn and Vbn (that is, only to an nMOS), only to Cbp and Vbp (that is, only to a pMOS), or both of Cbn and Vbn and Cbp and Vbp.

The present embodiment will focus attention on the correlation between the operating rate of an IC chip and a power supply voltage. The operating rate of an IC chip is considerably susceptible to a power supply voltage. Therefore, when a power supply voltage is higher than a predetermined value, a sufficient operating rate can be generally obtained for an IC chip and thus it is not necessary to apply a forward substrate bias to the IC chip.

The present embodiment will describe the control circuit 115 for controlling a forward substrate bias according to a voltage supplied to a power supply line VDD. The control circuit 115 of the present embodiment controls the substrate bias Vb to zero bias when the voltage supplied to the power supply line VDD is higher than a predetermined reference voltage.

The semiconductor integrated circuit device 101 of FIG. 19 includes a comparator 401.

The comparator 401 is a two-input one-output comparator. The comparator 401 compares a voltage inputted to one of the input terminals and a voltage inputted to the other input terminal and outputs a comparison result COMP.

In the present embodiment, one of the input terminals of the comparator 401 is connected to the power supply line VDD and the other input terminal is connected to a reference voltage Vref. The comparator 401 compares VDD and Vref. In the case of VDD>Vref, the comparator 401 outputs COMP=L such that the substrate bias Vb becomes a zero bias (ZBB). In the case of VDD≦Vref, the comparator 401 outputs COMP=H such that the substrate bias Vb becomes a forward bias (FBB). H and L in COMP may be set in an opposite way from the logic.

The control circuit 115 is a circuit for outputting the control signal Cb. The control circuit 115 controls the value of the control signal Cb according to the comparison result COMP and chip information CHIP_ID. The chip information CHIP_ID is a value determined by the relationship between a threshold value Vth of the chip in the logic circuit 111 and a target threshold value Vth_target. In the present embodiment, in the case of Vth>Vth_target, it is necessary to apply a forward substrate bias to the chip to reduce the threshold value of the chip (that is, to increase an operating rate) and thus CHIP_ID=H is set. In the case of Vth≦Vth_target, it is not necessary to apply a forward substrate bias to the chip and thus CHIP_ID=L is set. H and L in CHIP_ID may be set in an opposite way from the logic.

In the present embodiment, when the control signal Cb is H, the substrate bias Vb is set at FBB. When the control signal Cb is L, the substrate bias Vb is set at ZBB. H and L in the control signal Cb may be set in an opposite way from the logic.

FIG. 20 is a table for explaining the control signal Cb of the ninth embodiment.

As shown in FIG. 20, the control circuit 115 receives the comparison result COMP and the chip information CHIP_ID, and controls the control signal Cb so as to apply a forward substrate bias to the chip only when VDD<Vref and Vth>Vth_target are satisfied.

In the case where the semiconductor integrated circuit device 101 does not include the control circuit 115 and the comparator 401 of the present embodiment, a forward substrate bias is applied to the chip even when the power supply voltage exceeds the predetermined value. In this case, the higher the power supply voltage, the higher the substrate bias Vb, thereby increasing the power consumption. In the present embodiment, the substrate bias Vb becomes a zero bias when the power supply voltage exceeds the predetermined reference voltage, thereby suppressing an increase in power consumption.

FIG. 21 shows a specific example of the circuit shown in FIG. 19.

In FIG. 21, the control circuit 115 is made up of an AND circuit X. The AND circuit X is fed with the comparison result COMP and the chip information CHIP_ID, and the control signal Cb is outputted from the AND circuit X.

Tenth Embodiment

FIG. 22 is a circuit diagram showing a semiconductor integrated circuit device 101 of a tenth embodiment. The present embodiment is a modification of the ninth embodiment.

Differences from the ninth embodiment will be mainly described in the present embodiment.

In the ninth embodiment, as shown in FIG. 23, a voltage supplied to a power supply line VDD sometimes comes close to a reference voltage Vref. In this case, noise superimposed on the power supply line VDD frequently switches ZBB mode and FBB mode. In ZBB mode, a substrate bias Vb is set at ZBB (zero bias). In FBB mode, the substrate bias Vb is set at FBB (forward bias).

The frequent switching of modes causes an unstable operation of an IC chip. Thus in the present embodiment, mode control is performed using a first reference voltage Vref1 and a second reference voltage Vref2.

In the present embodiment, when the voltage supplied to the power supply line VDD is not lower than the first reference voltage Vref1, the substrate bias Vb can be controlled to a zero bias. When the voltage supplied to the power supply line VDD is not higher than the second reference voltage Vref2, the substrate bias Vb can be controlled to a forward bias.

The semiconductor integrated circuit device 101 of FIG. 22 includes a comparator 401 and a selecting switch 402.

The selecting switch 402 has two inputs and one output and outputs one of two inputted signals. The selecting switch 402 switches signals to be outputted, in response to a reference voltage control signal REF. In the present embodiment, the selecting switch 402 is fed with the first reference voltage Vref1 and the second reference voltage Vref2. The relationship of Vref1>Vref2 is satisfied between the first reference voltage Vref1 and the second reference voltage Vref2. The reference voltage control signal REF is a signal outputted by a control circuit (not shown). The selecting switch 402 outputs Vref1 when REF is logically H (=High), and outputs Vref2 when REF is logically L (=Low). H and L in the reference voltage control signal REF may be set in an opposite way from the logic.

The comparator 401 is a two-input one-output comparator. The comparator 401 compares a voltage inputted to one of the input terminals and a voltage inputted to the other input terminal and outputs a comparison result COMR. In the present embodiment, one of the input terminals of the comparator 401 is connected to the power supply line VDD and the other input terminal is connected to the output of the selecting switch 402. Thus in the present embodiment, Vref1 or Vref2 is inputted to the comparator 401 through the selecting switch 402.

A control circuit 115 is a circuit for outputting a control signal Cb. The control circuit 115 controls the value of the control signal Cb according to the comparison result COMP, the reference voltage control signal REF, and chip information CHIP_ID according to timing specified by a set signal SET.

Therefore, the control circuit 115 has four input terminals and one output terminal. The input terminals are fed with one of the comparison result COMP, the reference voltage control signal REF, the chip information CHIP_ID, and the set signal SET.

The set signal SET is a signal for determining timing for causing the control circuit 115 to capture the comparison result COMP and the state of the reference voltage control signal REF. It is not necessary to limit the timing for capturing the state of the chip information CHIP_ID. The control circuit 115 of the present embodiment captures COMP and the state of REF at the rising edge of SET. The control circuit 115 may capture COMP and the state of REF at the falling edge of SET instead of the rising edge of SET. The chip information CHIP_ID is set as in the ninth embodiment.

The control signal Cb is outputted from the output terminal of the control circuit 115. When Cb is H, the substrate bias Vb is set at FBB. When Cb is L, the substrate bias Vb is set at ZBB. H and L in Cb may be set in an opposite way from the logic.

The value of the control signal Cb is, as shown in FIG. 24, controlled according to the comparison result COMP, the reference voltage control signal REF, and the chip information CHIP_ID.

In the case of CHIP_ID=H, as shown in FIG. 24, Vref1 is selected for REF=H and Vref2 is selected for REF=L. When Vref1 is selected, the substrate bias Vb is set at ZBB for VDD>Vref1 and the control signal Cb keeps the previous value for VDD≦Vref1 (see FIG. 24). When Vref2 is selected, the substrate bias Vb is set at FBB for VDD≦Vref2 and the control signal Cb keeps the previous value for VDD>Vref2 (see FIG. 24).

In the case of CHIP_ID=L, it is not necessary to apply a forward substrate bias to a chip and thus the control signal Cb is always set at L. In other words, the substrate bias Vb is always set at ZBB.

As described above, in the present embodiment, VDD is compared with Vref1 and Vref2 and the substrate bias Vb is controlled according to the comparison result.

FIG. 25 illustrates the relationship among Vref1, Vref2, and VDD. FIG. 26 is a table for explaining the control signal Cb of the tenth embodiment. FIG. 27 is a timing chart of COMP=H in the tenth embodiment.

As shown in FIG. 25, the effect of the present embodiment is clarified particularly when a potential difference between Vref1 and Vref2 is made larger than the amplitude of external noise.

In FIG. 25, frequent switching between ZBB mode and FBB mode is avoided and the semiconductor integrated circuit device 101 stays in one of the modes. In this case, as shown in FIGS. 26 and 27, the control signal Cb is kept at a constant value and is not frequently switched. As shown in FIG. 27, in the case of REF=H, COMP is captured by the control circuit 115 at the rising edge of SET and Cb is outputted from the control circuit 115 at the falling edge of SET in the present embodiment. The reference voltage control signal REF is repeatedly turned on/off at predetermined intervals, so that VDD is compared with both of Vref1 and Vref2.

Figure 28:
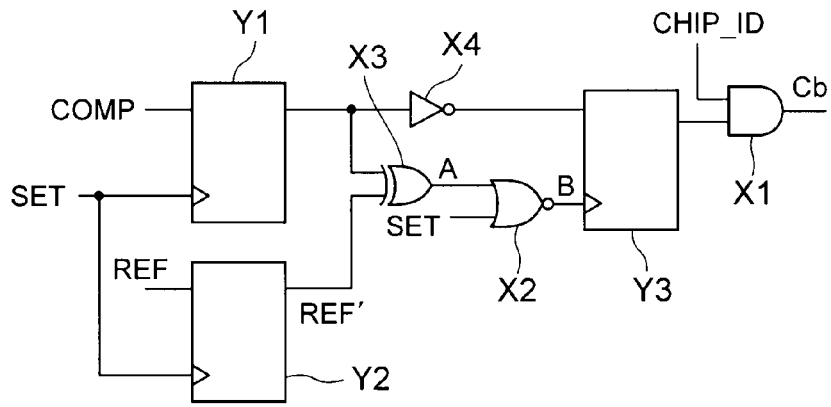
FIG. 28 shows a specific example of the circuit shown in FIG. 22.

FIG. 28 shows a specific example of the circuit shown in FIG. 22. In FIG. 28, the control circuit 115 is made up of an AND circuit X1, a NOR circuit X2, an ExOR circuit X3, a NOT circuit X4, and flip-flops Y1, Y2 and Y3. Reference characters A, B and REF' in FIG. 28 correspond to reference characters A, B, and REF' in FIG. 27.

The present embodiment is applicable not only to a forward substrate bias but also to a reverse substrate bias. For example, the control signal Cb may be controlled such that the substrate bias Vb can be set at a zero bias for VDD<Vref2 and can be set at a reverse bias for VDD>Vref1.

Eleventh Embodiment

Figure 29:
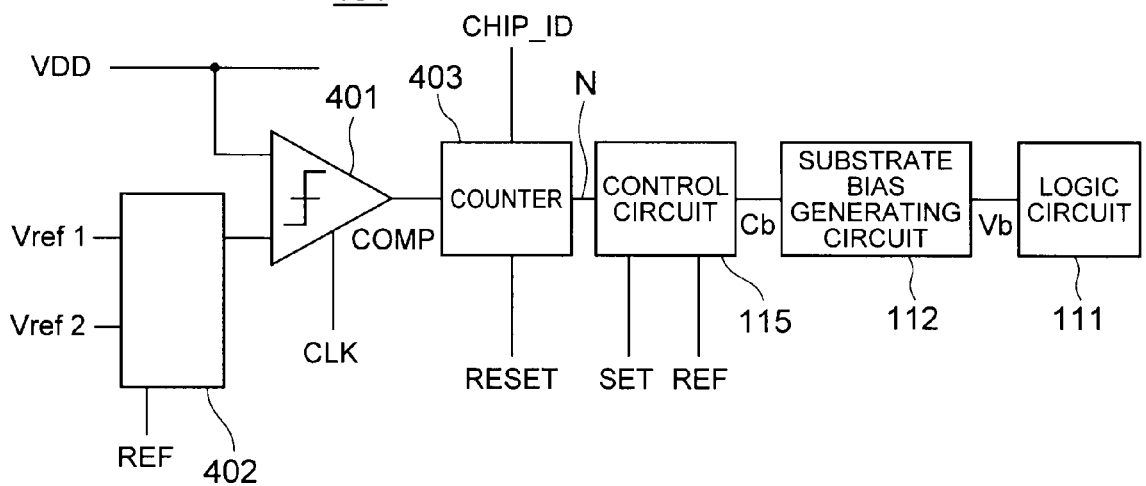
FIG. 29 is a circuit diagram showing a semiconductor integrated circuit device of an eleventh embodiment.

FIG. 29 is a circuit diagram showing a semiconductor integrated circuit device 101 of an eleventh embodiment. The present embodiment is a modification of the tenth embodiment. Differences from the tenth embodiment will be mainly described in the present embodiment.

The semiconductor integrated circuit device 101 of FIG. 29 includes a comparator 401, a selecting switch 402, and a counter 403.

The selecting switch 402 has two inputs and one output and outputs one of inputted two signals. The selecting switch 402 switches signals to be outputted, in response to a reference voltage control signal REF. The details of the selecting switch 402 of the present embodiment are similar to those of the selecting switch 402 of the tenth embodiment.

The comparator 401 is a two-input one-output comparator of edge trigger type. The comparator 401 compares a voltage inputted to one of the input terminals and a voltage inputted to the other input terminal and outputs a comparison result COMP. The comparator 401 of the present embodiment compares voltages a fixed number of times within a fixed time period in response to a clock signal CLK.

The counter 403 has one input and one output and counts the number of times when an inputted signal is H. The counter 403 may count the number of times when the inputted signal is L.

In the present embodiment, the comparison result COMP is inputted to the counter 403. The counter 403 counts the number of times when the comparison result COMP is H and outputs a count value "N". The number of counts of the counter 403 is reset in response to a reset signal RESET for determining timing for causing the counter 403 to reset the number of counts.

A control circuit 115 is a circuit for outputting a control signal Cb. The control circuit 115 controls the value of the control signal Cb according to the count value "N", the reference voltage control signal REF, and chip information CHIP_ID according to timing specified by a set signal SET.

When REF=H is satisfied, the count value "N" indicates the number of times when VDD>Vref1 is satisfied. In this case, the control circuit 115 sets the control signal Cb at L when the count value "N" is not smaller than a fixed value. In this situation, a substrate bias Vb is set at ZBB.

When REF=L is satisfied, the count value "N" indicates the number of times when VDD>Vref2 is satisfied. In this case, the control circuit 115 sets the control signal Cb at H when the count value "N" is not larger than the fixed value. In this situation, the substrate bias Vb is set at FBB.

Thus in the present embodiment, the values of VDD are averaged and the influence of noise on the values of VDD is reduced. Consequently, in the present embodiment, a potential difference between Vref1 and Vref2 can be smaller than that of the tenth embodiment, thereby reducing the values of VDD.

Figure 30:
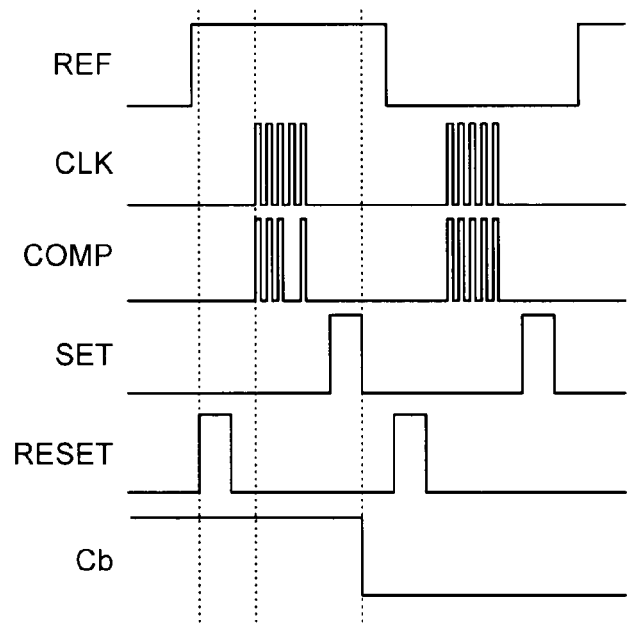
FIG. 30 is a timing chart of the eleventh embodiment.
Figure 31:
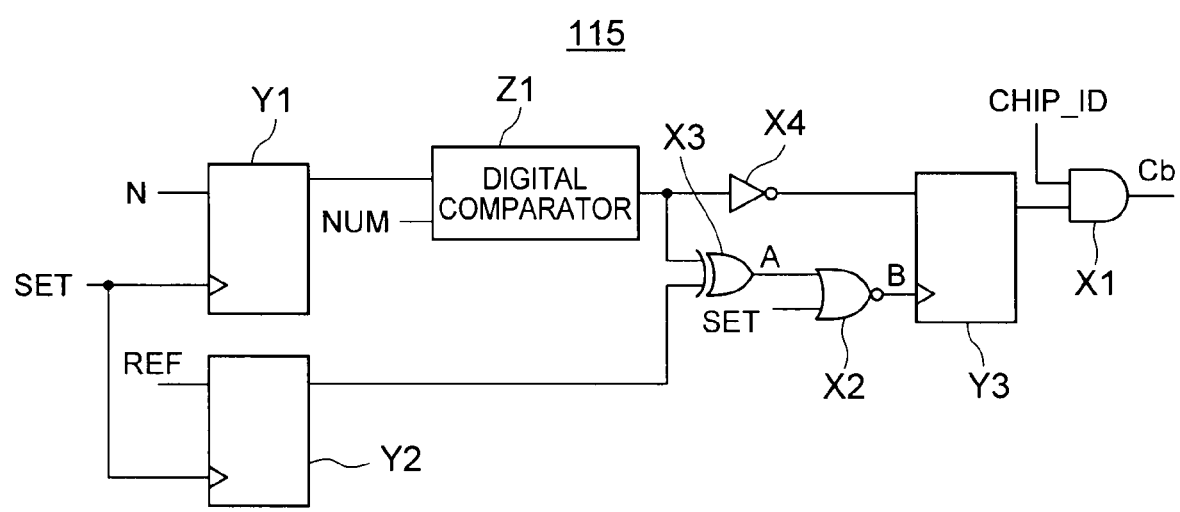
FIG. 31 is a specific example of the circuit of FIG. 29.

FIG. 30 is a timing chart of the eleventh embodiment. FIG. 31 is a specific example of the circuit of FIG. 29.

The selecting switch 402 selects a first reference voltage Vref1 or a second reference voltage Vref2 in response to REF and outputs the selected reference voltage.

The comparator 401 performs a comparison in response to CLK and outputs the comparison result COMP. The counter 403 resets the number of counts when RESET is H.

After the number of counts is reset, the counter 403 counts the number of times when the comparison result COMP is H, and outputs the count value "N".

The control circuit 115 captures the count value "N" according to timing specified by SET and compares the count value "N" and a comparison value "NUM" (see FIG. 31). The control circuit 115 outputs the control signal Cb corresponding to the comparison result of "N" and "NUM". The reference voltage control signal REF is repeatedly turned on/off at predetermined intervals, so that VDD is compared with both of Vref1 and Vref2.

In FIG. 31, the control circuit 115 is made up of an AND circuit X1, a NOR circuit X2, an ExOR circuit X3, a NOT circuit X4, flip-flops Y1, Y2 and Y3, and a digital comparator Z1.

The present embodiment is applicable not only to a forward substrate bias but also to a reverse substrate bias as in the tenth embodiment.

Twelfth Embodiment

Figure 32:
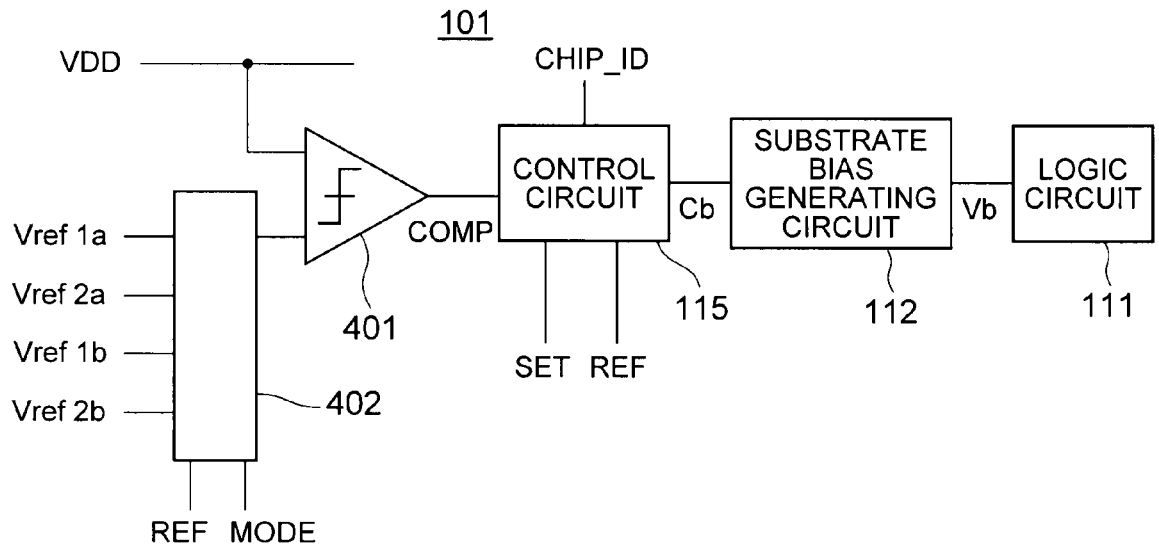
FIG. 32 is a circuit diagram showing a semiconductor integrated circuit device 101 of a twelfth embodiment.

FIG. 32 is a circuit diagram showing a semiconductor integrated circuit device 101 of a twelfth embodiment. The present embodiment is a modification of the tenth embodiment.

Differences from the tenth embodiment will be mainly described in the present embodiment.

The semiconductor integrated circuit device 101 of FIG. 32 includes a comparator 401 and a selecting switch 402.

The selecting switch 402 has four inputs and one input and outputs one of inputted four signals. The selecting switch 402 switches signals to be outputted, in response to a reference voltage control signal REF and an operation mode signal MODE.

In the present embodiment, the value of VDD changes with the operation mode. The value of VDD is VDDa in operation mode A and is VDDb in operation mode B. Thus in the present embodiment, it is necessary to change the reference voltage value according to the operation mode.

In the present embodiment, the selecting switch 402 is fed with four reference voltages Vref1a, Vref2a, Vref1b, and Vref2b.

The reference voltages Vref1a and Vref2a indicate first and second reference voltages in operation mode A. The relationship of Vref1a>Vref2a is satisfied between the first reference voltage Vref1a and the second reference voltage Vref2a. These reference voltages are selected when the operation mode signal MODE is H.

The reference voltages Vref1b and Vref2b indicate first and second reference voltages in operation mode B. The relationship of Vref1b>Vref2b is satisfied between the first reference voltage Vref1b and the second reference voltage Vref2b. These reference voltages are selected when the operation mode signal MODE is L. H and L in the operation mode signal MODE may be set in an opposite way from the logic.

The comparator 401 is a two-input one-output comparator. The comparator 401 compares a voltage inputted to one of the input terminals and a voltage inputted to the other input terminal and outputs a comparison result COMP. The details of the comparator 401 of the present embodiment are similar to those of the comparator 401 of the tenth embodiment.

The present embodiment is applicable not only to two VDD values but also to "n" VDD values. "n" represents an integer not smaller than 3. In this case, the selecting switch 402 is fed with "2n" reference voltages.

Thirteenth Embodiment

Figure 33:
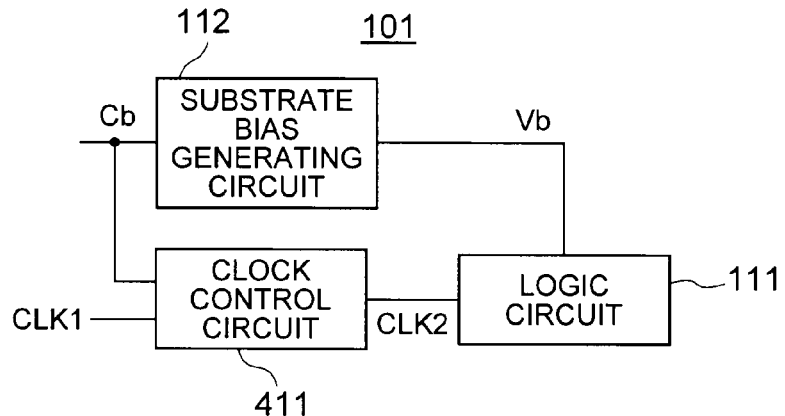
FIG. 33 is a circuit diagram showing semiconductor integrated circuit device of a thirteenth embodiment.

FIG. 33 is a circuit diagram showing semiconductor integrated circuit device 101 of a thirteenth embodiment.

The semiconductor integrated circuit device 101 of FIG. 33 includes a clock control circuit 411. The clock control circuit 411 generates a clock signal CLK2 from a clock signal CLK1 and supplies the clock signal CLK2 to a logic circuit 111.

The present embodiment is a modification of the ninth to twelfth embodiments. Differences from the ninth to twelfth embodiments will be mainly described in the present embodiment.

Figure 34:
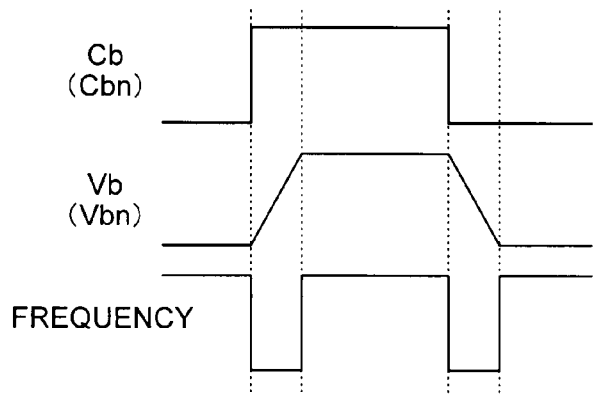
FIG. 34 is a timing chart in the thirteenth embodiment.

In the ninth to twelfth embodiments, the control signal Cb sometimes changes with a change of VDD. Therefore, it is necessary to ensure an operation at the switching of the control signal Cb. Thus in the present embodiment, at the switching of the control signal Cb, the supply of the clock signal CLK2 to the logic circuit 111 is stopped and the device is kept in a standby state until a substrate bias Vb is stabilized, so that the operation is ensured. An example of the standby processing is shown in the timing chart of FIG. 34.

Fourteenth Embodiment

FIG. 35 is a circuit diagram showing a semiconductor integrated circuit device 101 of a fourteenth embodiment.

The semiconductor integrated circuit device 101 includes at least one logic circuit 111 and at least one substrate bias generating circuit 112. The logic circuit 111 is identical in circuit configuration to the logic circuit 111 of any one of the first to thirteenth embodiments. The substrate bias generating circuit 112 is identical in circuit configuration to the substrate bias generating circuit 112 of any one of the first to thirteenth embodiments.

In the fourteenth embodiment, the body of each pMOS and the body of each nMOS in the substrate bias generating circuit 112 are connected to a substrate bias line Vbp for a PMOS and a substrate bias line Vbn for an nMOS, respectively.

This state is shown in FIG. 2 (first embodiment), FIG. 6 (second embodiment), FIG. 7 (third embodiment), FIG. 14 (sixth embodiment), FIG. 16 (seventh embodiment), and FIG. 18 (eighth embodiment). For example, the bodies of switch transistors 133 and 143 are connected to the substrate bias lines Vbn and Vbp, respectively.

Thus in the fourteenth embodiment, the substrate bias generating circuit 112 and the logic circuit 111 to which a substrate bias is applied can be disposed on the same well. In FIG. 35, a substrate bias generating circuit 1 and logic circuits 1 and 2 are all disposed on a P well 1 and an N well 1. Further, a substrate bias generating circuit 2 and the logic circuits 1 and 2 are all disposed on a P well 3 and an N well 3. Moreover, a substrate bias generating circuit 3 and the logic circuits 1 and 2 are all disposed on a P well 5 and an N well 5.

Thus in the fourteenth embodiment, as shown in FIG. 35, the substrate bias generating circuits 112 can be disposed in a region where an element such as a power supply strap is not disposed. With this configuration, in the fourteenth embodiment, it is possible to suppress an increase in circuit area when the substrate bias generating circuits 112 are mounted.

Fifteenth Embodiment

FIG. 36 is a circuit diagram showing a semiconductor integrated circuit device 101 of a fifteen embodiment.

The semiconductor integrated circuit device 101 has a logic cell portion and a portion other than the logic cell (fill cell portion). FIG. 36 illustrates a logic cell 211 and a fill cell 212 which compose the semiconductor integrated circuit device 101.

The logic cell 211 and the fill cell 212 are provided on the same substrate. In the semiconductor integrated circuit device 101, a substrate bias can be generated by applying a current to the substrate. The substrate includes a semiconductor substrate such as a silicon substrate, for example, a bulk semiconductor substrate such as a bulk silicon substrate.

In the logic cell 211, a pMOS 121 and an nMOS 122 which make up a CMOS are disposed. The pMOS 121 and the nMOS 122 of the fifteenth embodiment are transistors identical in configuration to the PMOS 121 and the nMOS 122 of the first embodiment. The gate, source, drain, and body of the pMOS 121 are connected like the PMOS 121 of the first embodiment. The gate, source, drain, and body of the nMOS 122 are connected like the nMOS 122 of the first embodiment.

As in the first embodiment, parasitic diodes 123 and 124 are respectively present between the source and body and between the drain and body of the pMOS 121. Further, as in the first embodiment, parasitic diodes 125 and 126 are respectively present between the source and body and between the drain and body of the nMOS 122. Moreover, as in the first embodiment, the pMOS 121 and the nMOS 122 compose an inverter in this configuration. The PMOS 121 and the nMOS 122 may not compose an inverter.

In a cell base design including various logic cells, a fill cell is disposed in a region where the logic cells are not disposed. In the fifteenth embodiment, a PN junction placed on such a fill cell is used and is connected between a power supply line VDD and a substrate bias line Vbp and between a ground line VSS and a substrate bias line Vbn.

In the fill cell 212, a pMOS transistor 221 and an nMOS transistor 222 are disposed. The gate of the PMOS 221 and the gate of the nMOS 222 are connected to the power supply line VDD and the ground line VSS, respectively. Further, the source of the pMOS 221 and the source of the nMOS 222 are connected to the power supply line VDD and the ground line VSS, respectively. Moreover, the drain of the PMOS 221 and the drain of the nMOS 222 are connected to the power supply line VDD and the ground line VSS, respectively. Further, the body of the pMOS 221 and the body of the nMOS 222 are connected to the substrate bias line Vbp for a pMOS and the substrate bias line Vbn for an nMOS, respectively. Parasitic diodes 223 and 224 are present respectively between the source and body and between the drain and body of the pMOS 221. Parasitic diodes 225 and 226 are present respectively between the source and body and between the drain and body of the nMOS 222.

As described above, in the present embodiment, the pMOS 221 and the nMOS 222 are disposed in the fill cell 212 which is an empty space. Further, in the present embodiment, the source and drain of the PMOS 221 are connected to the power supply line VDD and the source and drain of the nMOS 222 are connected to the ground line VSS. Thus in the present embodiment, the parasitic diodes 223 and 224 are interposed between the power supply line VDD and the substrate bias line Vbp and the parasitic diodes 225 and 226 are interposed between the ground line VSS and the substrate bias line Vbn. Therefore, in the present embodiment, the PN junction area of the semiconductor integrated circuit device 101 is increased by the parasitic diodes 223 to 226 as compared with that in the case of the absence of the pMOS 221 and the nMOS 222.

By using the pMOS 221 and the nMOS 222, the PN junction area of the semiconductor integrated circuit device 101 can be adjusted. The PN junction area can be increased by increasing the number of pMOS 221 and nMOS 222. The PN junction area can be reduced by reducing the number of pMOS 221 and nMOS 222.

Thus in the present embodiment, variations in PN junction area in the logic cell 211 are absorbed by variations in PN junction area in the fill cell 212, so that the PN junction area of the semiconductor integrated circuit device 101 can be kept constant regardless of the utilization of a cell.

Thus in the present embodiment, it is possible to optimize the amount of substrate current. The pMOS 221 and the nMOS 222 of the fill cell 212 can be also used for adjusting the PN junction area and the gate wiring area of the semiconductor integrated circuit device 101.

By connecting PN junction in the fill cell 212 to the power supply line VDD with a metal, PN junction acts as a load capacitance between the power supply line VDD and a substrate. Thus it is possible to suppress fluctuations in substrate potential.

In the present embodiment, as described above, the source and drain of the pMOS 221 are both connected to the power supply line VDD, and the source and drain of the nMOS 222 are both connected to the ground line VSS.

With this configuration, in the present embodiment, the source and drain of the pMOS 221 are at the same potential and the source and drain of the nMOS 222 are at the same potential.

Therefore, in the present embodiment, the influence of leakage current on the pMOS 221 and the nMOS 222 is reduced.

One of the pMOS 221 and the nMOS 222 corresponds to an example of a transistor of a first conductivity type in the fill cell and the other corresponds to an example of a transistor of a second conductivity type in the fill cell.

Figure 42A:
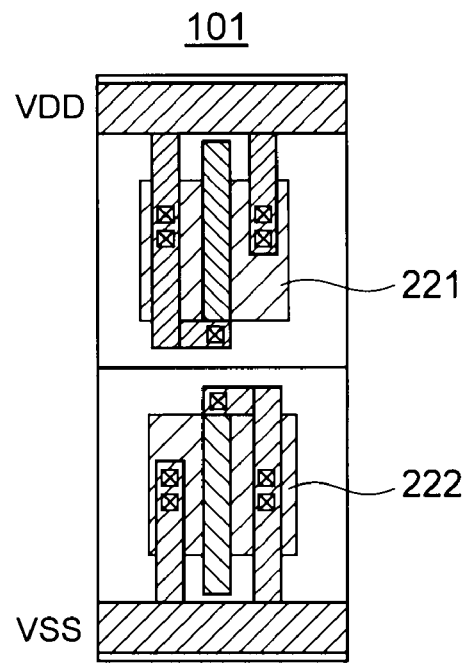
FIG. 42A shows an example of the wiring layout of the semiconductor integrated circuit device according to the fifteenth embodiment.
Figure 42B:
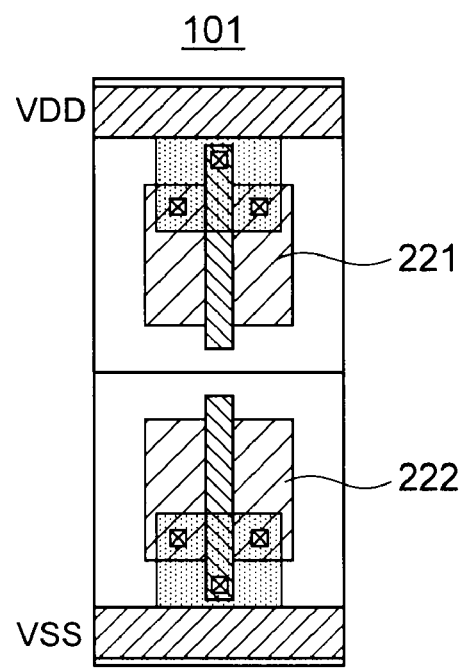
FIG. 42B shows an example of the wiring layout of the semiconductor integrated circuit device according to the fifteenth embodiment.

FIGS. 42A and 42B show examples of the wiring layout of the semiconductor integrated circuit device 101 according to the fifteenth embodiment. FIGS. 42A and 42B show examples of the layout of the power supply line VDD and the ground line VSS along with examples of the layout of the pMOS 221 and the nMOS 222 in the fill cell 212.

The present embodiment described a structural example in which the PMOS transistor and the nMOS transistor are disposed in the fill cell 212. It is not always necessary to dispose the transistors in the fill cell and thus a p-type diffusing portion and an n-type diffusing portion may be disposed instead.

Sixteenth Embodiment

Figure 37:
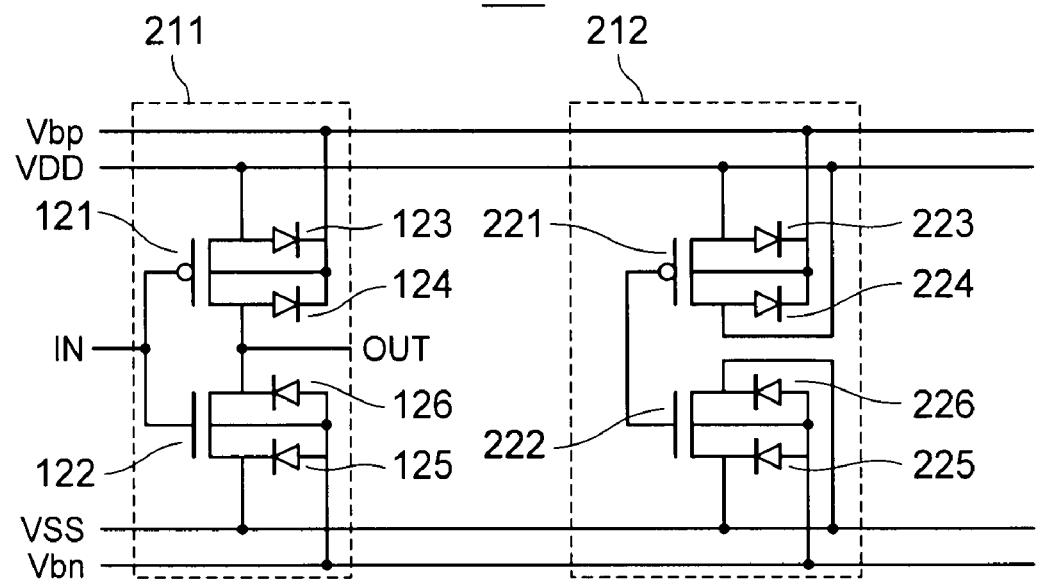
FIG. 37 is a circuit diagram showing a semiconductor integrated circuit device of a sixteenth embodiment.

FIG. 37 is a circuit diagram showing a semiconductor integrated circuit device 101 of a sixteenth embodiment. The sixteenth embodiment is a modification of the fifteenth embodiment. Differences from the fifteenth embodiment will be mainly described in the sixteenth embodiment.

In the fifteenth embodiment, as shown in FIG. 36, the gate of the pMOS 221 and the gate of the nMOS 222 are connected to the power supply line VDD and the ground line VSS, respectively, whereas in the sixteenth embodiment, as shown in FIG. 37, the gate of a pMOS 221 and the gate of an nMOS 222 are connected via wiring.

It is generally said that in a sub-100 nm process, gate wiring has to be regularly etched to increase the accuracy of machining.

Regarding the accuracy of machining, since the gate of a transistor in a logic cell 211 is identical to the gate of a transistor in a fill cell 212 in the present embodiment, high accuracy of machining can be obtained. Further, in the present embodiment, the gates of the pMOS 221 and the nMOS 222 are floating nodes. Since the gates of the PMOS 221 and the nMOS 222 are floating nodes, it is possible to reduce the wiring resource and the gate leakage of the pMOS 221 and the nMOS 222.

On the other hand, in the present embodiment, the floating nodes may be eliminated by connecting the gates of the pMOS 221 and the nMOS 222 to the power supply line VDD or the ground line VSS (or another fixed potential line).

Figure 43A:
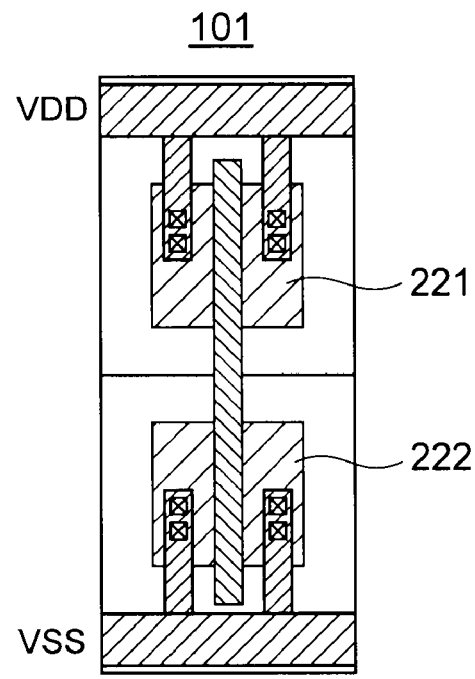
FIG. 43A shows an example of the wiring layout of the semiconductor integrated circuit device according to the sixteenth embodiment.
Figure 43B:
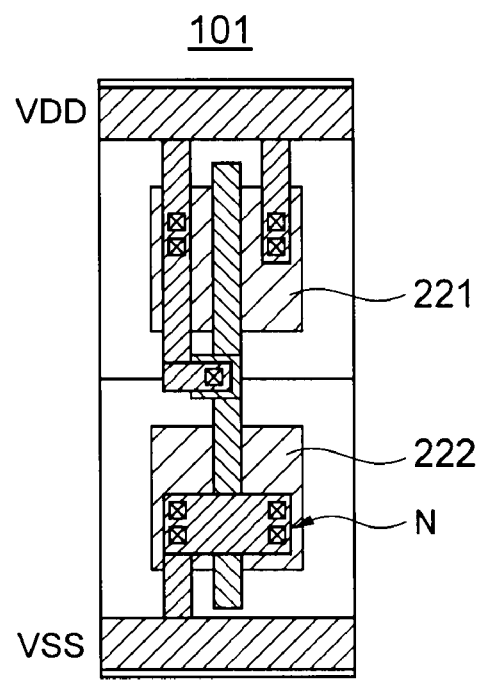
FIG. 43B shows an example of the wiring layout of the semiconductor integrated circuit device according to the sixteenth embodiment.

FIGS. 43A and 43B show examples of the wiring layout of the semiconductor integrated circuit device 101 according to the sixteenth embodiment. FIGS. 43A and 43B show examples of the layout of the power supply line VDD and the ground line VSS along with examples of the layout of the pMOS 221 and the nMOS 222 in the fill cell 212. In FIG. 43A, the gates of the pMOS 221 and the nMOS 222 are floating nodes. In FIG. 43B, the gates of the pMOS 221 and the nMOS 222 are connected to the power supply line VDD. Further, in FIG. 43B, as indicated by an arrow N, wiring between the source of the nMOS 222 and the ground line VSS and wiring between the drain of the nMOS 222 and the ground line VSS are shared.

Seventeenth Embodiment

Figure 38:
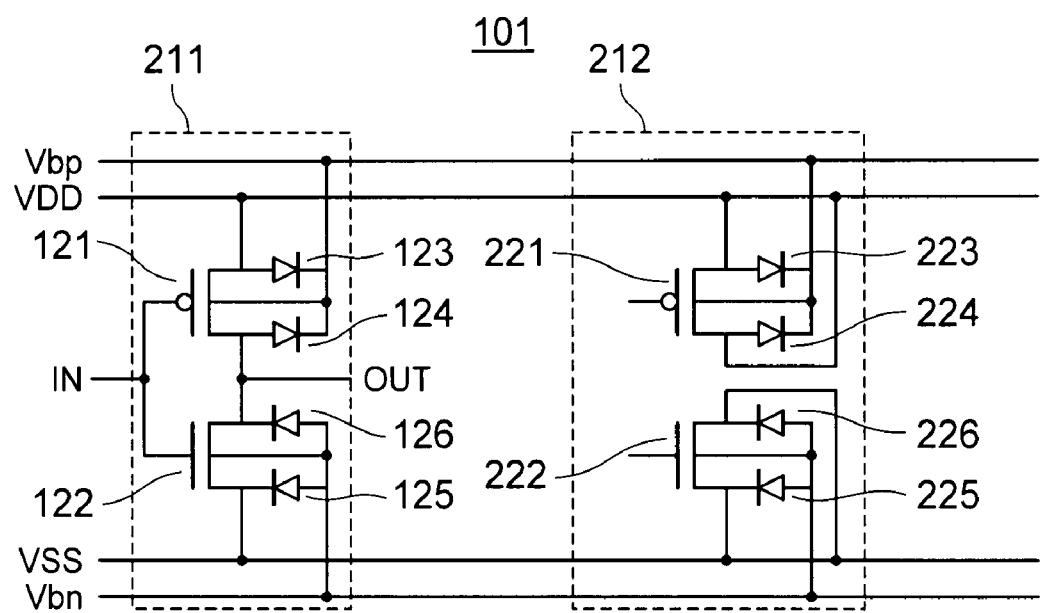
FIG. 38 is a circuit diagram showing a semiconductor integrated circuit device of a seventeenth embodiment.

FIG. 38 is a circuit diagram showing a semiconductor integrated circuit device 101 of a seventeenth embodiment. The seventeenth embodiment is a modification of the fifteenth embodiment. Differences from the fifteenth embodiment will be mainly described in the seventeenth embodiment.

In the fifteenth embodiment, as shown in FIG. 36, the gate of the pMOS 221 and the gate of the nMOS 222 are connected to the power supply line VDD and the ground line VSS, respectively, whereas in the seventeenth embodiment, as shown in FIG. 38, the gate of a pMOS 221 and the gate of an nMOS 222 are not connected to any lines.

With this configuration, it is not necessary to secure a gate contact region for the pMOS 221 and the nMOS 222 in the present embodiment, thereby reducing the circuit area of a fill cell 212. Although the gate voltages of the PMOS 221 and the nMOS 222 cannot be specified in the present embodiment, no serious problem arises because the sources and drains are at the same potential and are connected to a power supply line VDD or a ground line VSS.

Figure 44:
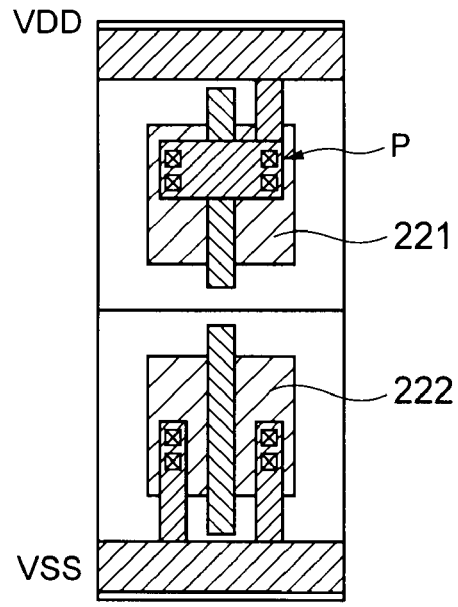
FIG. 44 shows an example of the wiring layout of the semiconductor integrated circuit device according to the seventeenth embodiment.

FIG. 44 shows an example of the wiring layout of the semiconductor integrated circuit device 101 according to the seventeenth embodiment. FIG. 44 shows an example of the layout of the power supply line VDD and the ground line VSS along with an example of the layout of the PMOS 221 and the nMOS 222 in the fill cell 212. In FIG. 44, as indicated by an arrow P, wiring between the source of the PMOS 221 and the power supply line VDD and wiring between the drain of the PMOS 221 and the power supply line VDD are shared.

Eighteenth Embodiment

Figure 39:
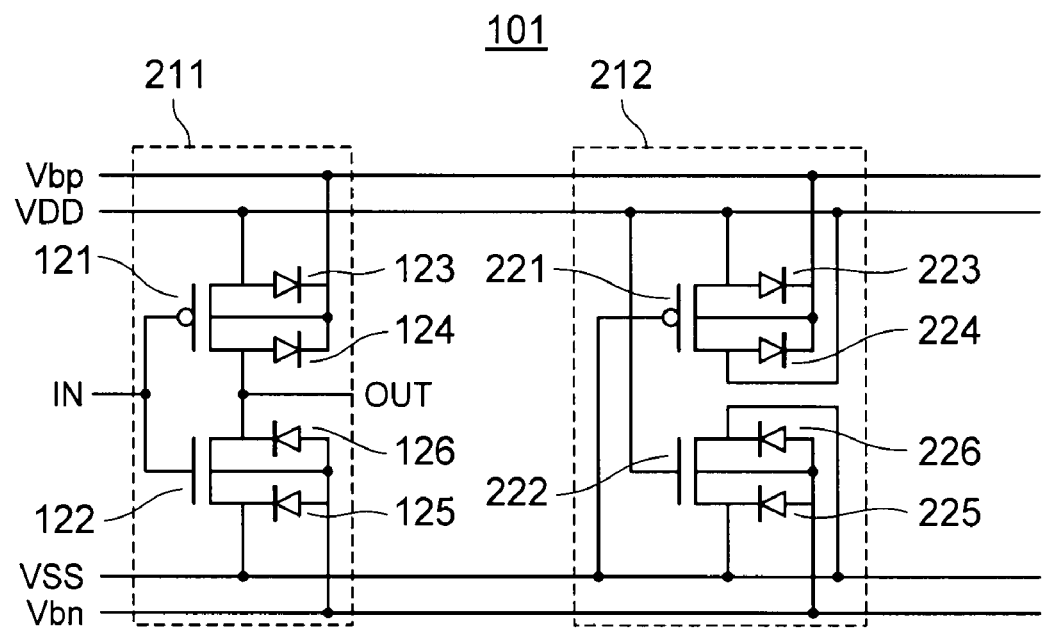
FIG. 39 is a circuit diagram showing a semiconductor integrated circuit device of an eighteenth embodiment.

FIG. 39 is a circuit diagram showing a semiconductor integrated circuit device 101 of an eighteenth embodiment. The eighteenth embodiment is a modification of the fifteenth embodiment. Differences from the fifteenth embodiment will be mainly described in the eighteenth embodiment.

In the fifteenth embodiment, as shown in FIG. 36, the gate of the PMOS 221 and the gate of the nMOS 222 are connected to the power supply line VDD and the ground line VSS, respectively, whereas in the eighteenth embodiment, as shown in FIG. 39, the gate of a pMOS 221 and the gate of an nMOS 222 are connected to a ground line VSS and a power supply line VDD.

Thus in the present embodiment, channels are formed on the pMOS 221 and the nMOS 222 and the effective PN junction area of the pMOS 221 and the nMOS 222 is increased.

Figure 45:
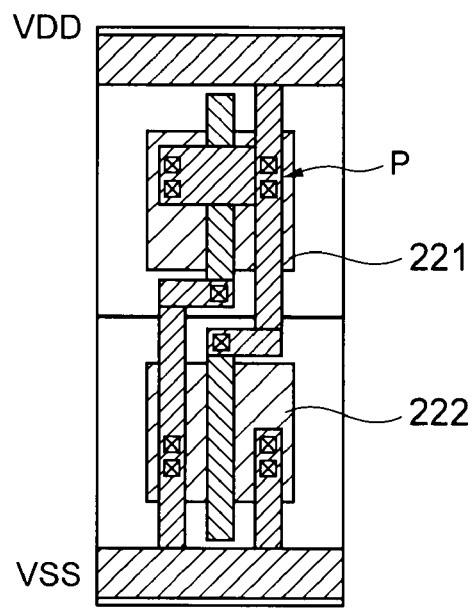
FIG. 45 shows an example of the wiring layout of the semiconductor integrated circuit device according to the eighteenth embodiment.

FIG. 45 shows an example of the wiring layout of the semiconductor integrated circuit device 101 according to the eighteenth embodiment. FIG. 45 shows an example of the layout of the power supply line VDD and the ground line VSS along with an example of the layout of the pMOS 221 and the nMOS 222 in a fill cell 212. In FIG. 45, as indicated by an arrow P, wiring between the source of the pMOS 221 and the power supply line VDD and wiring between the drain of the pMOS 221 and the power supply line VDD are shared.

Nineteenth Embodiment

Figure 40:
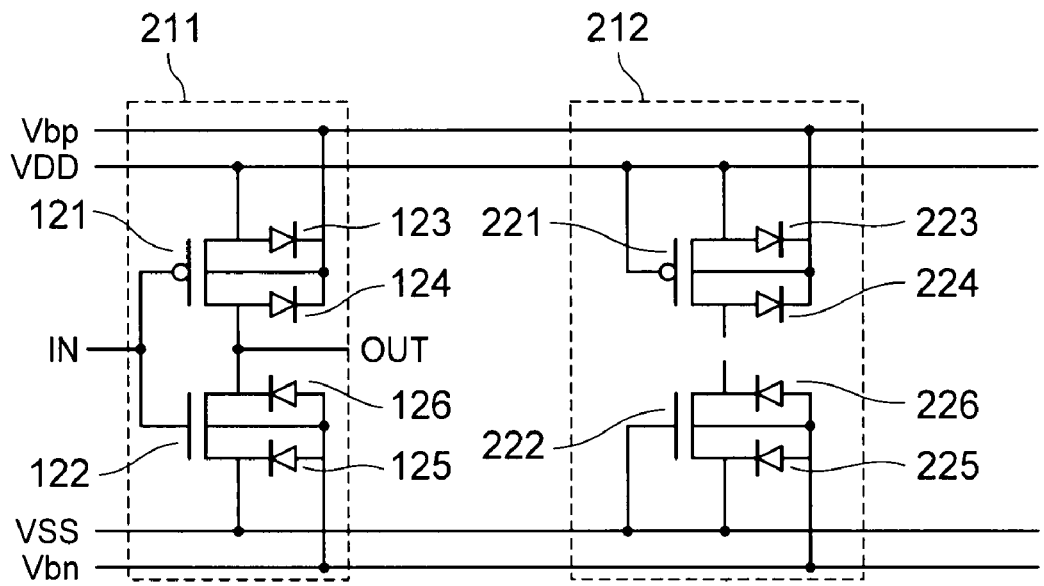
FIG. 40 is a circuit diagram showing a semiconductor integrated circuit device of a nineteenth embodiment.

FIG. 40 is a circuit diagram showing a semiconductor integrated circuit device 101 of a nineteenth embodiment. The nineteenth embodiment is a modification of the fifteenth embodiment. Differences from the fifteenth embodiment will be mainly described in the nineteenth embodiment.

In the fifteenth embodiment, as shown in FIG. 36, the drain of the pMOS 221 and the drain of the nMOS 222 are connected to the power supply line VDD and the ground line VSS, respectively, whereas in the nineteenth embodiment, as shown in FIG. 40, the drain of a PMOS 221 and the drain of an nMOS 222 are not connected to any lines.

Generally, a transistor for a logic circuit has the source connected to a power supply line or a ground line and the drain connected to an output terminal. The potential of the drain fluctuates with the output logic. For example, when the outputs of a pMOS and an nMOS which compose an inverter are L, a substrate current passes through the source and drain of the nMOS but passes only through the source of the pMOS. A PN junction on the drain side may affect the substrate current depending upon the logical value of an output.

According to the present embodiment, the influence of a PN junction on the drain side is avoided in the transistor of a fill cell. In the present embodiment, the gates of the pMOS 221 and the nMOS 222 are connected to the power supply line VDD and the ground line VSS, respectively, and the drains of the pMOS 221 and the nMOS 222 are not connected to any lines. Thus among parasitic diodes 223 to 226, only the parasitic diodes 223 and 225 (PN junction on the source side) are interposed between the power supply line VDD and a substrate bias line Vbp and between the ground line VSS and a substrate bias line Vbn. The present embodiment is suitable for, for example, an accurate design of a PN junction area.

In the semiconductor integrated circuit device 101, a plurality of fill cells 212 of the fifteenth embodiment and a plurality of fill cells 212 of the nineteenth embodiment may be disposed so as to have a given ratio. The plurality of fill cells 212 of the nineteenth embodiment and a plurality of fill cells 212 of the twelfth embodiment may be disposed instead. Thus an output logical value can achieve a junction area equivalent to a given state of H and L in an actual logic cell 211.

Figure 46:
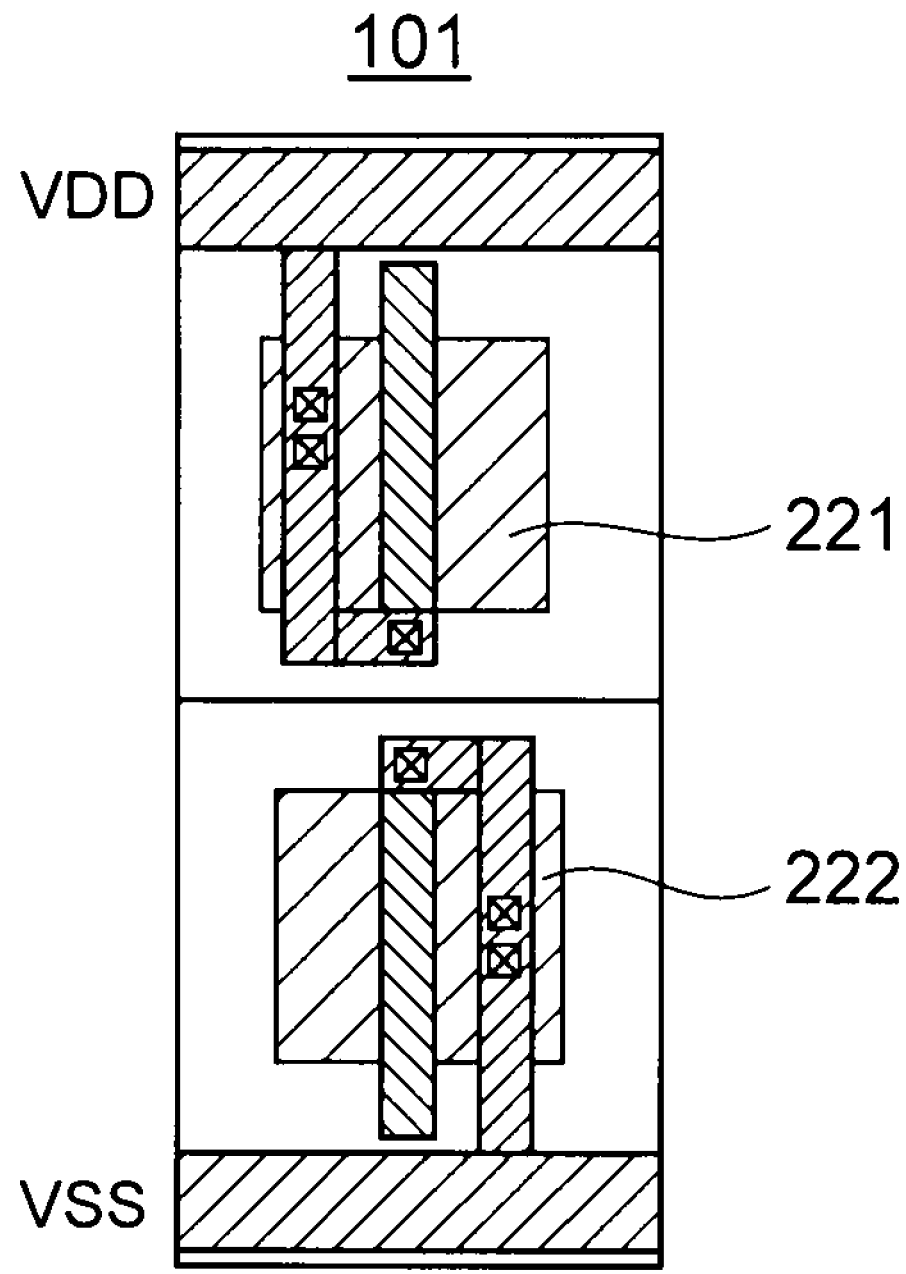
FIG. 46 shows an example of the wiring layout of the semiconductor integrated circuit device according to the nineteenth embodiment.

FIG. 46 shows an example of the wiring layout of the semiconductor integrated circuit device 101 according to the nineteenth embodiment. FIG. 46 shows an example of the layout of the power supply line VDD and the ground line VSS along with an example of the layout of the pMOS 221 and the nMOS 222 in the fill cell 212.

Twentieth Embodiment

Figure 41:
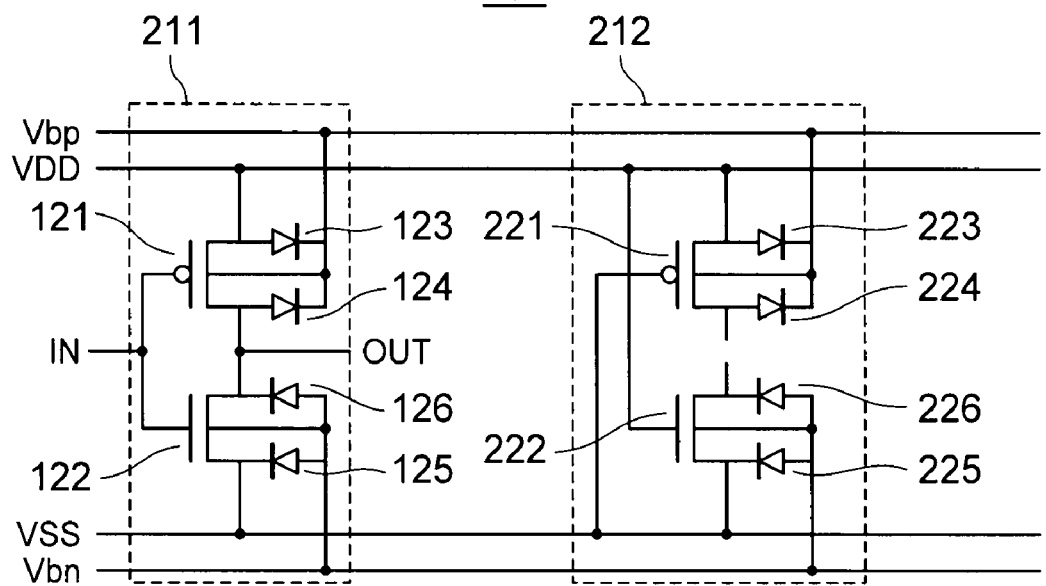
FIG. 41 is a circuit diagram showing a semiconductor integrated circuit device of a twentieth embodiment.

FIG. 41 is a circuit diagram showing a semiconductor integrated circuit device 101 of a twentieth embodiment. The twentieth embodiment is a modification of the eighteenth embodiment. Differences from the eighteenth embodiment will be mainly described in the twentieth embodiment.

In the eighteenth embodiment, as shown in FIG. 39, the drain of the pMOS 221 and the drain of the nMOS 222 are connected to the power supply line VDD and the ground line VSS, respectively, whereas in the twentieth embodiment, as shown in FIG. 41, the drain of a pMOS 221 and the drain of an nMOS 222 are not connected to any lines.

In the present embodiment, the drains of the pMOS 221 and the nMOS 222 are not connected to any lines and the gates of the pMOS 221 and the nMOS 222 are connected to a ground line VSS and a power supply line VDD, respectively. Thus the present embodiment is equivalent to a configuration in which channels are formed on the pMOS 221 and the nMOS 222 and the drains of the PMOS 221 and the nMOS 222 are effectively connected to the power supply line VDD and the ground line VSS. In other words, as in the eighteenth embodiment, the PN junction area of the pMOS 221 and the nMOS 222 of the twentieth embodiment is an added area of the PN junction area of the source side and the PN junction area of the drain side.

In the present embodiment, the drain wiring of the PMOS 221 and the nMOS 222 is not necessary. Thus other wiring can be routed through the drain regions of the pMOS 221 and the nMOS 222, so that wiring can be efficiently routed.

Figure 47A:
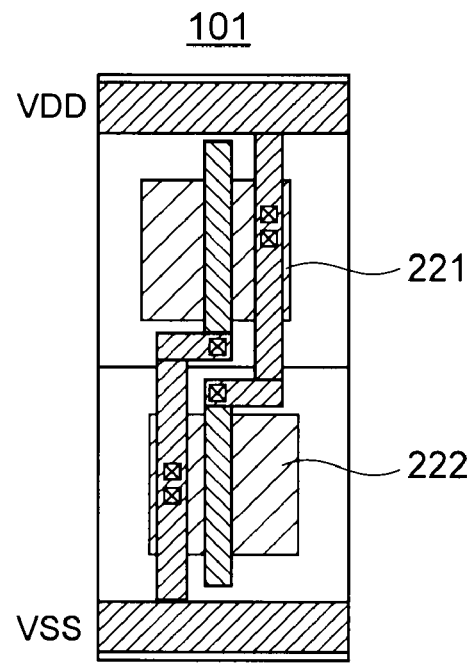
FIG. 47A shows an example of the wiring layout of the semiconductor integrated circuit device according to the twentieth embodiment.
Figure 47B:
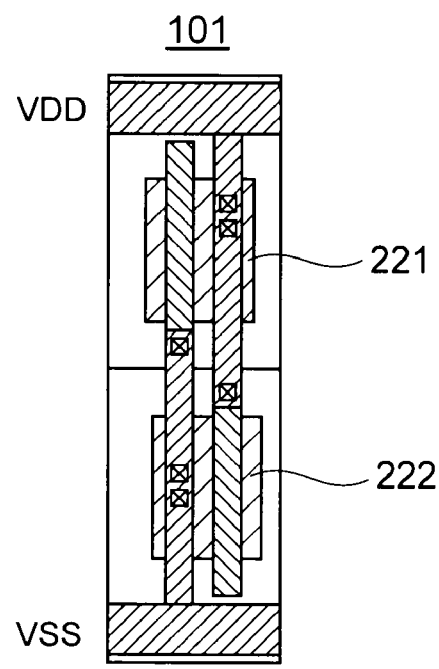
FIG. 47B shows an example of the wiring layout of the semiconductor integrated circuit device according to the twentieth embodiment.

FIGS. 47A and 47B show examples of the wiring layout of the semiconductor integrated circuit device 101 according to the twentieth embodiment. FIGS. 47A and 47B show examples of the layout of the power supply line VDD and the ground line VSS along with examples of the layout of the PMOS 221 and the nMOS 222 in a fill cell 212. In FIG. 47A, wiring to the PMOS 221 and the nMOS 222 is nonlinearly routed. In FIG. 47B, wiring to the pMOS 221 and the nMOS 222 is linearly routed.

What is claimed is:

1. A semiconductor integrated circuit device, comprising:
   a semiconductor substrate; and
   a first transistor of a first conductivity type and a second transistor of the first conductivity type, the transistors being connected in series between a first power supply line and a first substrate well provided on the semiconductor substrate,
   the first transistor of the first conductivity type having a source or drain connected to the first power supply line and a gate fed with a first control signal inputted from outside,
   the second transistor of the first conductivity type having a source or drain connected to the first substrate well and a gate connected to a second power supply line,
   the semiconductor integrated circuit device further comprising a first transistor of a second conductivity type and a second transistor of the second conductivity type, the transistors being connected in series between the second power supply line and a second substrate well provided on the semiconductor substrate,
   the first transistor of the second conductivity type having a source or drain connected to the second power supply line and a gate fed with a second control signal inputted from the outside,
   the second transistor of the second conductivity type having a source or drain connected to the second substrate well and a gate connected to the first power supply line.

2. The semiconductor integrated circuit device according to claim 1, further comprising a third transistor of the second conductivity type, the transistor being connected between the second power supply line and the first substrate well, the third transistor of the second conductivity type having a gate fed with the first control signal,
   the semiconductor integrated circuit device further comprising a third transistor of the first conductivity type, the transistor being connected between the first power supply line and the second substrate well,
   the third transistor of the first conductivity type having a gate fed with the second control signal.

3. The semiconductor integrated circuit device according to claim 2, further comprising a fourth transistor of the first conductivity type and a fifth transistor of the first conductivity type, the transistors being connected in series between the first power supply line and the first substrate well,
   the fourth transistor of the first conductivity type having a source or drain connected to the first power supply line and a gate fed with a third control signal inputted from the outside,
   the fifth transistor of the first conductivity type having a source or drain connected to the first substrate well and a gate connected to the second power supply line,
   the semiconductor integrated circuit device further comprising a fourth transistor of the second conductivity type and a fifth transistor of the second conductivity type, the transistors being connected in series between the second power supply line and the second substrate well,
   the fourth transistor of the second conductivity type having a source or drain connected to the second power supply line and a gate fed with a fourth control signal inputted from the outside,
   the fifth transistor of the second conductivity type having a source or drain connected to the second substrate well and a gate connected to the first power supply line.

4. The semiconductor integrated circuit device according to claim 1, further comprising a fourth transistor of the second conductivity type, the transistor being connected between the second power supply line and the first substrate well,
   the fourth transistor of the second conductivity type having a gate connected to the first substrate well, a source and a drain one of which is connected to the second power supply line, and the other connected to the first substrate well,
   the semiconductor integrated circuit device further comprising a fourth transistor of the first conductivity type, the transistor being connected between the first power supply line and the second substrate well,
   the fourth transistor of the first conductivity type having a gate connected to the second substrate well, a source and a drain one of which is connected to the first power supply line, and the other connected to the second substrate well.

5. The semiconductor integrated circuit device according to claim 3, further comprising a temperature monitor for measuring a temperature; and
   a control circuit that outputs the first to fourth control signals based on a measurement result of the temperature monitor,
   wherein when the measurement result is a high temperature, the control circuit turns on the first transistor of the first conductivity type and the first transistor of the second conductivity type in response to the first control signal and the second control signal, and turns on the fourth transistor of the first conductivity type and the forth transistor of the second conductivity type in response to the third control signal and the fourth control signal, and when the measurement result is a low temperature, the control circuit turns on the first transistor of the first conductivity type and the first transistor of the second conductivity type in response to the first control signal and the second control signal, and turns off the fourth transistor of the first conductivity type and the forth transistor of the second conductivity type in response to the third control signal and the fourth control signal.

6. The semiconductor integrated circuit device according to claim 2, further comprising:
   a comparator that compares a voltage of the first power supply line and a reference voltage and outputs a signal corresponding to a comparison result; and
   a control circuit that outputs the first control signal or the second control signal based on the output signal of the comparator.

7. The semiconductor integrated circuit device according to claim 6, wherein the voltage of the first power supply line is higher than a voltage of the second power supply line,
   when the voltage of the first power supply line is higher than a first reference voltage, the control circuit turns off the first transistor of the first conductivity type and the first transistor of the second conductivity type in response to the first control signal and the second control signal, and
   when the voltage of the first power supply line is not higher than a second reference voltage lower than the first reference voltage, the control circuit turns on the first transistor of the first conductivity type and the first transistor of the second conductivity type in response to the first control signal and the second control signal.

8. The semiconductor integrated circuit device according to claim 6, wherein the voltage of the first power supply line is higher than a voltage of the second power supply line,
   when the voltage of the first power supply line is higher than a first reference voltage in a first operation mode, the control circuit turns off the first transistor of the first conductivity type and the first transistor of the second conductivity type in response to the first control signal and the second control signal,
   when the voltage of the first power supply line is not higher than a second reference voltage lower than the first reference voltage in the first operation mode, the control circuit turns on the first transistor of the first conductivity type and the first transistor of the second conductivity type in response to the first control signal and the second control signal,
   when the voltage of the first power supply line is higher than a third reference voltage in a second operation mode in which the first power supply line has a different voltage from that in the first operation mode, the control circuit turns off the first transistor of the first conductivity type and the first transistor of the second conductivity type in response to the first control signal and the second control signal, and
   when the voltage of the first power supply line is not higher than a fourth reference voltage lower than the third reference voltage in the second operation mode, the control circuit turns on the first transistor of the first conductivity type and the first transistor of the second conductivity type in response to the first control signal and the second control signal.

9. The semiconductor integrated circuit device according to claim 6, further comprising a clock signal control circuit that controls a clock signal based on the control signal outputted from the control circuit, the clock signal being supplied to a logic circuit including the transistors connected between the first power supply line and the second power supply line,
   wherein the clock signal control circuit stops supplying the clock signal to the logic circuit when the control signal is switched.

10. The semiconductor integrated circuit device according to claim 1, further comprising a logic circuit including the transistors connected between the first power supply line and the second power supply line,
    wherein the first transistor of the second conductivity type and the second transistor of the second conductivity type are formed on the first substrate well,
    the first transistor of the first conductivity type and the second transistor of the first conductivity type are formed on the second substrate well, and
    the logic circuit is formed on at least one of the second substrate well and the first substrate well.

11. A semiconductor integrated circuit device, comprising:
    a semiconductor substrate; and
    a first transistor of a first conductivity type and a first transistor of a second conductivity type, the transistors being connected in series between a first power supply line and a first substrate well provided on the semiconductor substrate,
    the first transistor of the first conductivity type having a source or drain connected to the first power supply line and a gate fed with a first control signal inputted from outside,
    the first transistor of the second conductivity type having a source or drain connected to the first substrate well and a gate connected to the first power supply line,
    the semiconductor integrated circuit device further comprising a second transistor of the first conductivity type and a second transistor of the second conductivity type, the transistors being connected in series between a second power supply line and a second substrate well provided on the semiconductor substrate,
    the second transistor of the second conductivity type having a source or drain connected to the second power supply line and a gate fed with a second control signal inputted from the outside,
    the second transistor of the first conductivity type having a source or drain connected to the second substrate well and a gate connected to the second power supply line.

12. The semiconductor integrated circuit device according to claim 11, further comprising a third transistor of the second conductivity type, the transistor being connected between the second power supply line and the first substrate well,
    the third transistor of the second conductivity type having a gate fed with the first control signal,
    the semiconductor integrated circuit device further comprising a third transistor of the first conductivity type, the transistor being connected between the first power supply line and the second substrate well,
    the third transistor of the first conductivity type having a gate fed with the second control signal.

13. A semiconductor integrated circuit device, comprising:
    a semiconductor substrate;
    a logic cell formed on the semiconductor substrate; and
    a fill cell disposed in a region different from the logic cell on the semiconductor substrate,
    wherein the fill cell includes a plurality of pairs of transistors of a first conductivity type and a second conductivity type, the transistor of the second conductivity type being formed on a first substrate well, the transistor of the first conductivity type being formed on a second substrate well.

14. The semiconductor integrated circuit device according to claim 13, wherein the transistor of the first conductivity type of the plurality of pairs has a source and drain connected to a first power supply line, and the transistor of the second conductivity type of the plurality of pairs has a source and drain connected to a second power supply line.

15. The semiconductor integrated circuit device according to claim 14, wherein the transistor of the first conductivity type of the plurality of pairs has a gate connected to the first power supply line, and the transistor of the second conductivity type of the plurality of pairs has a gate connected to the second power supply line.

16. The semiconductor integrated circuit device according to claim 14, wherein the transistor of the first conductivity type and the transistor of the second conductivity type of the plurality of pairs have commonly connected gates.

17. The semiconductor integrated circuit device according to claim 14, wherein the transistor of the first conductivity type and the transistor of the second conductivity type of the plurality of pairs have open gates.

18. The semiconductor integrated circuit device according to claim 14, wherein the transistor of the first conductivity type of the plurality of pairs has a gate connected to the second power supply line, and the transistor of the second conductivity type of the plurality of pairs has a gate connected to the first power supply line.

19. The semiconductor integrated circuit device according to claim 13, wherein the transistor of the first conductivity type of the plurality of pairs has a source connected to a first power supply line, the transistor of the first conductivity type of the plurality of pairs has an open drain, the transistor of the second conductivity type of the plurality of pairs has a source connected to a second power supply line, and the transistor of the second conductivity type of the plurality of pairs has an open drain.

* * * * *